(12) United States Patent
Wang et al.

(10) Patent No.: US 10,928,605 B2
(45) Date of Patent: Feb. 23, 2021

(54) ADJUSTABLE OPTICAL LENS AND CAMERA MODULE AND MANUFACTURING METHOD THEREOF

(71) Applicant: NINGBO SUNNY OPOTECH CO., LTD., Zhejiang (CN)

(72) Inventors: Mingzhu Wang, Ningbo (CN); Bojie Zhao, Ningbo (CN); Liang Ding, Ningbo (CN); Chunmei Liu, Ningbo (CN); Feifan Chen, Ningbo (CN); Nan Guo, Ningbo (CN); Heng Jiang, Ningbo (CN)

(73) Assignee: Ningbo Sunny Opotech Co., Ltd., Zhejiang (CN)

( * ) Notice: Subject to any disclaimer, the term of this patent is extended or adjusted under 35 U.S.C. 154(b) by 0 days.

(21) Appl. No.: 16/238,474

(22) Filed: Jan. 2, 2019

(65) Prior Publication Data
US 2019/0137721 A1    May 9, 2019

Related U.S. Application Data

(62) Division of application No. 15/057,041, filed on Feb. 29, 2016, now Pat. No. 10,222,573.

(51) Int. Cl.
*G02B 7/00* (2006.01)
*H01L 27/146* (2006.01)
(Continued)

(52) U.S. Cl.
CPC .......... *G02B 7/003* (2013.01); *B29C 65/7802* (2013.01); *G02B 7/006* (2013.01);
(Continued)

(58) Field of Classification Search
CPC .......... G02B 7/003; G02B 7/09; G02B 7/021; G02B 7/006; G02B 7/025; H04N 5/2257;
(Continued)

(56) References Cited

U.S. PATENT DOCUMENTS

| 5,969,887 | A  | * | 10/1999 | Hagimori | G02B 7/026 |
|---|---|---|---|---|---|
| | | | | | 359/811 |
| 6,154,255 | A  | * | 11/2000 | Shishido | G02B 7/023 |
| | | | | | 348/375 |
| 6,704,151 | B2 | * | 3/2004 | Nishimura | G02B 7/025 |
| | | | | | 359/819 |
| 2003/0011902 | A1 | * | 1/2003 | Nishimura | G02B 7/025 |
| | | | | | 359/819 |

(Continued)

*Primary Examiner* — Albert H Cutler
(74) *Attorney, Agent, or Firm* — Raymond Y. Chan; David and Raymond Patent

(57) ABSTRACT

An adjustable optical lens and camera module and manufacturing method thereof are provided, wherein the camera module includes an optical sensor and an adjustable optical lens. The adjustable optical lens, which is arranged in a photosensitive path of the optical sensor, includes an optical structural member and at least two lenses. Each of the lens is arranged in an internal space of the optical structural member along an axial direction of the optical structural member, wherein before packaging the adjustable optical lens and the optical sensor, at least one position of the lens in the internal space of the optical structural member is able to be adjusted, so that a central axis line of the adjustable optical lens and a central axis line of the optical sensor are coincided, so as to improve the image quality of the camera module.

3 Claims, 17 Drawing Sheets

(51) Int. Cl.
    *G02B 7/02*          (2006.01)
    *G02B 7/09*          (2006.01)
    *H04N 5/225*        (2006.01)
    *B29C 65/78*        (2006.01)

(52) U.S. Cl.
    CPC ............ *G02B 7/021* (2013.01); *G02B 7/025* (2013.01); *G02B 7/09* (2013.01); *H01L 27/14618* (2013.01); *H04N 5/2253* (2013.01); *H04N 5/2254* (2013.01); *H04N 5/2257* (2013.01)

(58) Field of Classification Search
    CPC . H04N 5/2253; H04N 5/2254; B29C 65/7802
    See application file for complete search history.

(56) References Cited

U.S. PATENT DOCUMENTS

| | | | | |
|---|---|---|---|---|
| 2007/0047110 | A1* | 3/2007 | Matsushima | G02B 7/023 359/819 |
| 2010/0053776 | A1* | 3/2010 | Tanaka | G02B 9/60 359/793 |
| 2011/0075021 | A1* | 3/2011 | Chang | G02B 7/022 348/374 |
| 2011/0286737 | A1* | 11/2011 | Kim | G03B 17/02 396/533 |
| 2012/0002306 | A1* | 1/2012 | Takahashi | G02B 7/023 359/813 |
| 2014/0204476 | A1* | 7/2014 | Takase | G02B 7/021 359/738 |
| 2016/0349478 | A1* | 12/2016 | Shirono | G03B 3/02 |

\* cited by examiner

ADJUSTABLE OPTICAL LENS AND CAMERA MODULE AND MANUFACTURING METHOD THEREOF

CROSS REFERENCE OF RELATED APPLICATION

This is a Divisional application that claims the benefit of priority under 35 U.S.C. § 120 to a non-provisional application, application Ser. No. 15/057,041, filed Feb. 29, 2016. The afore-mentioned patent application is hereby incorporated by reference in its entirety.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to an optical equipment, and more particularly to an adjustable optical lens and camera module and the manufacturing method thereof.

Description of Related Arts

As mobile electronic devices have become popular, a camera module related technologies applied to mobile electronic devices for images capturing (e.g. videos or pictures) for the user have been rapidly developed and improved. Meanwhile, the camera module has recently and widely applied to various fields, including health care, safety and security, and industrial production fields, and etc.

The conventional camera module comprises an optical lens and an optical sensor. The optical lens is arranged along a photosensitive path of the optical sensor within a barrel, and that lights reflected from an object can enter an inside of the camera module through the optical lens and be received by the optical sensor to proceed photoelectric conversion, so that images respective to the object can be subsequently captured by the camera module.

As the camera module has been further applied to various fields and industries, the quality for captured images of the camera module for the market is strictly required. However, due to the limitation of the molding and packaging technique of the camera module and the manufacturing process of the optical lens of the camera module, the current camera module in the market can barely fulfill the application needs of the high quality camera module for the market. More particularly, the conventional optical lens usually comprises a plurality of lens which are aligned overlappingly with each other and molded together. In the optical lens, a central axis lines of the optical lens can be affected by a position of the central axis line of each lens. The most ideal condition is that the central axis line of each lens are coincided with each other. However, because of the limitation of the packaging technique, there are certain deviation generated among central axis lines of each lens. Also, because each lens need to be arranged on the case of optical lens through a gluing or welding process, a position and inclination of each lens are affected by the gluing and welding material, so that the central axis line of the optical lens has a greater deviation by packaging each overlapped lens in the camera case. In the process of packaging the optical lens and the optical sensor together to form the camera module, it is difficult to ensure that the central axis line of the optical lens and the central axis line of the optical sensor are aligned. Once, there is a deviation between the central axis line of the optical lens and the central axis line of the optical sensor, the image quality of the camera module will certainly be affected. Therefore, in the process of producing the camera module, a way to ensure the image quality of the produced camera module and to solve a series of problems mentioned above is highly required in the current market.

SUMMARY OF THE PRESENT INVENTION

The invention is advantageous in that it provides an adjustable optical lens and camera module and manufacturing method thereof, wherein the adjustable optical lens comprises an optical structural member and at least two lenses. The lenses are overlappingly and spacedly arranged in an internal space of the optical structural member, and the position of at least one of the lens in the internal space of the optical structural member is adjustably arranged.

Another advantage of the present invention is to provide an adjustable optical lens and camera module and manufacturing method thereof, wherein the adjustable optical lens includes a diaphragm. The diaphragm is arranged on a top position of an optical structural member and is able to be adjusted respective to the position of the optical structural member.

Another advantage of the invention is to provide an adjustable optical lens and camera module and manufacturing method thereof, wherein the central axis line of the adjustable optical lens is able to be adjusted through changing the position of the lens in the internal space of the optical structural member. For example, while the position of the lens in the internal space of the optical structural member is adjusted, the central axis lines of the adjustable optical lens and the lens set formed by each lens are coincided, so as to increase the yield rate of the adjustable optical lens.

Another advantage of the present invention is to provide an adjustable camera lens and camera module and manufacturing method thereof, which changes current manufacturing method of camera module by preassembling optical lenses into optical structural member to be adjusted to reach resolution requirement and affixed, so as to form a fixed camera module. This reduces manufacturing procedures and is able to solve current issues of too much tolerance from the assembling with the manufacturing method of camera module and process defect of overlength tolerance chain in the assembling.

Another advantage of the present invention is to provide an adjustable camera lens and camera module and manufacturing method thereof, which reduces successive testing process, lowers testing cost, and has lower production cost and higher efficiency.

Another advantage of the invention is to provide an adjustable optical lens and camera module and manufacturing method thereof, wherein positions of the lens of the adjustable optical lens in the internal space of the optical structural member are able to be adjusted along at least one direction.

Another advantage of the invention is to provide an adjustable optical lens and camera module and manufacturing method thereof, wherein a horizontal position of each lens and/or diaphragm of the adjustable optical lens in the internal space of the optical structural member is able to be adjusted.

Another advantage of the invention is to provide an adjustable optical lens and camera module and manufacturing method thereof, wherein a vertical position of each lens and/or diaphragm of the adjustable optical lens in the internal space of the optical structural member is able to be adjusted.

Another advantage of the invention is to provide an adjustable optical lens and camera module and manufacturing method thereof, wherein a tilt position of each lens and/or diaphragm of the adjustable optical lens in the internal space of the optical structural member is able to be adjusted.

Another advantage of the invention is to provide an adjustable optical lens and camera module and manufacturing method thereof, wherein a position of each lens of the adjustable optical lens in the internal space of the optical structural member is able to be adjusted to rotate.

Another advantage of the invention is to provide an adjustable optical lens and camera module and manufacturing method thereof, wherein the optical structural member has at least one adjustment channels, and when the lens are packed in the internal space of the optical structural member to form the adjustable optical lens, the lens are arranged in the internal space of the optical structural member which is relative to the adjustment channel, so that the position of the lens in the internal space of the optical structural member from the external environment of the optical structural member is able to be adjusted through the adjustment channel, so as to simplify the operation process.

Another advantage of the invention is to provide an adjustable optical lens and camera module and manufacturing method thereof, in a manufacturing method for the camera module by packaging the adjustable optical lens and an optical sensor with each other, the position of at least one of the lens of the adjustable optical lens in the internal space of the optical structural member is able to be adjusted, so as to ensure that the central axis line of the adjustable optical lens of the camera module and the central axis line of the optical sensor are coincided.

Another advantage of the invention is to provide an adjustable optical lens and camera module and manufacturing method thereof, wherein when the position of the lens in the internal space of the optical structural member is adjusted, the adjustable optical lens and the optical sensor are packed. An offset generated between the adjusted optical lens and the optical sensor can be prevented in this process of packaging the adjustable optical lens and the optical sensor, so as to guarantee the reliability of the camera module.

Another advantage of the invention is to provide an adjustable optical lens and camera module and manufacturing method thereof, in the process of packaging the camera module, a range of deviation of the central axis line of the adjustable optical lens and the central axis line of the optical sensor can be adjusted within an acceptable range, so as to improve a yield rate and image quality for the camera module.

Another advantage of the present invention is to provide an adjustable optical lens and camera module and manufacturing method thereof, wherein camera modules made with this method are structurally tighter. Also, the manufacturing method is simple.

Another advantage of the present invention is to provide an adjustable optical lens and camera module and manufacturing method thereof, which is able to make camera modules have higher image quality through correcting the assembling positions of the adjustable optical elements with the image quality of the camera module as a standard.

Additional advantages and features of the invention will become apparent from the description which follows, and may be realized by means of the instrumentalities and combinations particular point out in the appended claims.

According to the present invention, the foregoing and other objects and advantages are attained by an adjustable optical lens and camera module and manufacturing method thereof, wherein the adjustable optical lens comprises:

an optical structural member; and at least two lens, wherein each of the lens is arranged in an internal space of the optical structural member along an axial direction of the optical structural member, wherein a position of at least one of the lens in the internal space of the optical structural member is adapted to be adjusted.

According to an embodiment of the present invention, the optical structural member has at least one adjustment channel to communicated the internal space of the optical structural member with the external environment, wherein the lens in the internal of the optical structural member is arranged on a position which is to corresponding to the adjustment channel, so that the position of the lens in the internal space of the optical structural member can be selectively adjusted through the adjustment channel.

According to an embodiment of the present invention, position of the optical lens adaptable to be adjusted in the internal space of the optical structural member is adaptable to be adjusted in at least one direction.

According to an embodiment of the present invention, the optical lens adaptable to be adjusted is preassembled in the inside of the optical structural member with adhesive, wherein the adhesive is in a half solidified condition.

According to an embodiment of the present invention, the adjustable optical lens further includes a diaphragm, wherein the diaphragm is preassembled on top of the optical structural member and on the same optical path with the optical lens, wherein the assembling position of the diaphragm is adaptable to be adjusted.

According to an embodiment of the present invention, assembling position of the diaphragm is adaptable to be adjusted in at least one direction corresponding to the position of the optical structural member.

According to an embodiment of the present invention, the diaphragm is preassembled through half solidifying adhesive.

According to an embodiment of the present invention, the adhesive used in preassembling is a mixed adhesive of an UV adhesive and a thermosetting adhesive, which become half solidified after ultraviolet exposure to achieve the preassembling, wherein after heating process the adhesive will be completely solidified, so as to affix the diaphragm.

According to an embodiment of the present invention, an adhesive injection channel is set at the position of the diaphragm, wherein the adhesive injection channel is corresponding to the optical lens that is adaptable to be adjusted, so as to affix the adjusted optical lens through injecting adhesive via the adhesive injection channel.

According to another aspect of the present invention, the present invention provides an adjustable optical lens, including:

an optical structural member;

at least one optical lens, wherein the optical lenses is set and affixed in the internal space of the optical structural member along the axial direction of the optical structural member; and a diaphragm, wherein the diaphragm is preassembled on the top of the optical structural member and on the top side of the optical lens, wherein the assembling position of the diaphragm is adaptable to be adjusted correspondingly to the spatial position of the optical structural member.

According to an embodiment of the present invention, the diaphragm is preassembled through half solidifying adhesive.

According to an embodiment of the present invention, the adhesive used in preassembling is a mixed adhesive of an UV adhesive and a thermosetting adhesive, which become half solidified after ultraviolet exposure to achieve the preassembling, wherein after heating process the adhesive will be completely solidified, so as to affix the diaphragm.

According to an embodiment of the present invention, the assembling position of the diaphragm is adaptable to be adjusted in at least one direction.

According to an embodiment of the present invention, the inner wall of the optical structural member has at least one limit structure, adapting to bear the optical lens.

According to another aspect of the present invention, the present invention provides a camera module, including:

a photosensitive device, wherein the photosensitive device includes an optical sensor; and an adjustable optical lens, wherein the adjustable optical lens is arranged in the path of photoreception of the optical sensor, wherein the adjustable optical lens comprises an optical structural member, at least an optical lens, and a diaphragm, wherein each optical lens is arranged in the internal space of the optical structural member along the axial direction of the optical structural member, wherein the diaphragm is arranged on the top of the optical structural member and on the top side of the optical lens, wherein at least one the optical lens is preassembled in the internal space of the optical structural member, wherein before packaging the adjustable optical lens and the photosensitive device, the assembling position of preassembled the optical lens inside of the optical structural member is adaptable to be adjusted, wherein after adjustment, imaging of the camera module is turned to meet the resolution requirement.

According to an embodiment of the present invention, the side wall of the optical structural member has at least one adjustment channel to connect the internal space of the optical structural member to the external environment, wherein the preassembled optical lens in the internal of the optical structural member to correspond to the adjustment channel, which is adaptable to adjust the position of the optical lens in the internal space of the optical structural member through the adjustment channel.

According to an embodiment of the present invention, the spatial position of the preassembled optical lens in the internal of the optical structural member is adaptable to be adjusted in at least one direction, wherein after adjustment, the central axis line of the adjustable optical lens and the central axis line of the optical sensor coincide or are within an allowable range of deviance.

According to an embodiment of the present invention, the side walls of the optical structural member corresponding to each of the preassembled optical lenses all have three adjustment channels separated from one another at 120 degrees, adaptable to adjust the horizontal and vertical position of the preassembled optical lenses at each of the adjustment channel.

According to an embodiment of the present invention, the preassembled optical lens is preassembled through half solidifying adhesive.

According to an embodiment of the present invention, the adhesive used in preassembling is a mixed adhesive of an UV adhesive and a thermosetting adhesive, which become half solidified after ultraviolet exposure to achieve the preassembling, wherein after heating process the adhesive will be completely solidified, so as to affix the whole adjustable optical lens.

According to an embodiment of the present invention, the photosensitive device further includes a filter, a lens mount, and a circuit board, wherein the filter is affixed on the lens mount, wherein the optical sensor is attached both on the top side of the circuit board and on the bottom side of the filter, wherein the optical structural member is affixed on the top side of the lens mount.

According to an embodiment of the present invention, the photosensitive device further includes a filter and a circuit board, wherein the filter is affixed on the optical structural member and located on the bottom side of the optical lens, wherein the optical sensor is attached both on the top side of the circuit board and on the bottom side of the filter, wherein the optical structural member is affixed correspondingly to the spatial distance between the optical sensor.

According to another aspect of the present invention, the present invention provides a camera module, including:

a photosensitive device, wherein the photosensitive device includes an optical sensor; and an adjustable optical lens, wherein the adjustable optical lens is arranged in the path of photoreception of the optical sensor, wherein the adjustable optical lens comprises an optical structural member, at least an optical lens, and a diaphragm, wherein each the optical lens is arranged in the internal space of the optical structural member along the axial direction of the optical structural member, wherein the diaphragm is preassembled on the top of the optical structural member, wherein before packaging the adjustable optical lens and the photosensitive device, the assembling position of the diaphragm is adaptable to be adjusted correspondingly to the spatial position of the optical structural member, wherein after adjustment, imaging of the camera module is turned to meet the resolution requirement.

According to an embodiment of the present invention, at least one optical lens is preassembled in the internal space of the optical structural member, wherein before packaging the adjustable optical lens and the photosensitive device, the spatial position of the preassembled optical lens inside of the optical structural member is adaptable to be adjusted.

According to an embodiment of the present invention, the assembling position of the optical lens is adaptable to be adjusted in at least one direction, wherein after adjustment, the central axis line of the adjustable optical lens and the central axis line of the optical sensor coincide or are within an allowable range of deviance.

According to an embodiment of the present invention, the sidewall of the optical structural member has at least one adjustment channel to connect the internal space of the optical structural member to the external environment, wherein the preassembled optical lens in the internal of the optical structural member to correspond to the adjustment channel, so that the position of the lens in the internal space of the optical structural member can be selectively adjusted through the adjustment channel.

According to an embodiment of the present invention, the sidewalls of the optical structural member corresponding to each of the preassembled optical lenses all have three adjustment channels separated from one another at 120 degrees, adaptable to adjust the horizontal and vertical position of the preassembled optical lenses at each of the adjustment channel.

According to an embodiment of the present invention, an adhesive injection channel is set at the position of the diaphragm, wherein the adhesive injection channel is corresponding to the optical lens that is adaptable to be adjusted, so as to affix the adjusted optical lens through injecting adhesive for solidification via the adhesive injection channel.

According to an embodiment of the present invention, the assembling position of the diaphragm is adaptable to be adjusted in at least one direction, wherein after adjustment, the central axis line of the adjustable optical lens and the central axis line of the optical sensor coincide or are within an allowable range of deviation.

According to an embodiment of the present invention, the diaphragm is preassembled on the top of the optical structural member through half solidifying adhesive.

According to an embodiment of the present invention, the preassembled optical lens is preassembled in the internal space of the optical structural member through half solidifying adhesive.

According to an embodiment of the present invention, the adhesive used in preassembling is a mixed adhesive of an UV adhesive and a thermosetting adhesive, which become half solidified after ultraviolet exposure to achieve the preassembling, wherein after heating process the adhesive will be completely solidified, so as to affix the whole adjustable optical lens.

According to an embodiment of the present invention, the photosensitive device further includes a filter, a lens mount, and a circuit board, wherein the filter is affixed on the lens mount, wherein the optical sensor is attached both on the top side of the circuit board and on the bottom side of the filter, wherein the optical structural member is affixed on the top side of the lens mount.

According to an embodiment of the present invention, the photosensitive device further includes a filter and a circuit board, wherein the filter is affixed on the optical structural member and located on the bottom side of the optical lens, wherein the optical sensor is attached both on the top side of the circuit board and on the bottom side of the filter, wherein the optical structural member is affixed correspondingly to the spatial distance between the optical sensor.

According to another aspect of the present invention, the present invention provides a manufacturing method of camera module, including the following steps:

(A) arranging an adjustable optical lens along a photosensitive path of an optical sensor comprised by an optical sensor;

(B) preassembling an adjustable optical element in an adjustable optical lens to complete a preassembly of a camera module;

(C) adjusting the assembling position of the adjustable optical element to make the imaging of the adjusted camera module meet the resolution requirement; and (D) packaging the adjustable optical lens and the photosensitive device so as to fix the camera module.

According to an embodiment of the present invention, the adjustable optical element is at least an optical lens, wherein in the step (B), at least one optical lens is preassembled in the adjustable optical lens, wherein by adjusting the assembling position of the preassembled optical lens, the central axis line of the adjustable optical lens and the central axis line of the optical sensor are made to coincide or be within an allowable range of deviation.

According to an embodiment of the present invention, the adjustable optical element is a diaphragm, wherein in the step (B), the diaphragm is preassembled on the top of the adjustable optical lens, wherein by adjusting the assembling position of the diaphragm, the central axis line of the adjustable optical lens and the central axis line of the optical sensor are made to be coincided or be within an allowable range of deviance.

According to an embodiment of the present invention, wherein the adjustable optical element is a diaphragm and at least an optical lens, wherein in the step (B), the diaphragm and at least one optical lens are preassembled in the adjustable optical lens, wherein by adjusting the assembling positions of the diaphragm and the preassembled optical lens, the central axis line of the adjustable optical lens and the central axis line of the optical sensor are made to be coincided or be within an allowable range of deviation.

According to an embodiment of the present invention, in the above methods, a side wall of an optical structural member included by the adjustable optical lens has at least one adjustment channel thereon to connect the internal space of the optical structural member to the external environment, wherein the preassembled optical lens in the internal of the optical structural member corresponds to the adjustment channel, adaptable to adjust the spatial position of the optical lens inside of the optical structural member through the adjustment channel.

According to an embodiment of the present invention, in the step (D), by a glue dispensing process in the adjustment channel to seal the adjustment channel and conducting heating process to solidify the adhesive for preassembling and the adhesive for glue dispensing, the adjusted optical lens is affixed, so as to further fix the whole camera module.

According to an embodiment of the present invention, in the step (D), by a glue dispensing process in the adjustment channel to seal the adjustment channel and conducting heating process to solidify the adhesive for preassembling and the adhesive for glue dispensing, the adjusted optical lens and the diaphragm are fixed, so as to further fix the whole camera module.

According to an embodiment of the present invention, in the step (D), the diaphragm has at least an adhesive injection channel thereon, wherein the adhesive injection channel is corresponding to the preassembled optical lens, wherein by injecting adhesive into the adhesive injection channel and conducting heating process to solidify the adhesive for preassembling and the adhesive for glue dispensing, the adjusted optical lens is affixed, so as to further fix the whole camera module.

According to an embodiment of the present invention, in the step (D), the diaphragm has at least an adhesive injection channel thereon, wherein the adhesive injection channel is corresponding to the preassembled optical lens, wherein by injecting adhesive into the adhesive injection channel and conducting heating process to solidify the adhesive for preassembling and the adhesive for glue dispensing, the adjusted optical lens and the diaphragm are fixed, so as to further fix the whole camera module.

According to an embodiment of the present invention, in the above methods, assembling position of the adjustable optical element is adjusted through adjusting at least any one direction of the horizontal direction, vertical direction, tilt direction, and peripheral direction of the adjustable optical element.

According to an embodiment of the present invention, in the above methods, the adjustable optical element is preassembled with adhesive, wherein the adhesive used for preassembling is a mixed adhesive of an UV adhesive and a thermosetting adhesive, which become half solidified after ultraviolet exposure to achieve the preassembling of the adjustable optical element in the step (B), wherein in step (D) after heating process, the adhesive will be completely solidified, to fix the whole camera module.

According to an embodiment of the present invention, the step (C) includes the following steps:

(C1) capturing imaging of the preassembled camera module;

(C2) calculating calibration measurement for the adjustable optical element with software based on the imaging of the camera module; and (C3) adjusting assembling position of the adjustable optical element according to the calibration measurement.

According to an embodiment of the present invention, in the step (C), if the imaging of the camera module fails to meet the resolution requirement after the adjustable optical element was adjusted, the steps (C1) to (C3) need to be repeated until the imaging of the adjusted camera module meet the resolution requirement.

According to an embodiment of the present invention, in the step (C1), the preassembled camera module is powered on and imaging of the camera module is captured, wherein the capturing of the imaging of the camera module is based on shooting MTF testing chart with the camera module, wherein the MTF value is applied to represent the imaging quality of the camera module. A greater MTF value indicates a higher imaging quality of the camera module. Every time when the imaging of the camera module is captured, a MTF value corresponding to the imaging needs to be calculated. The MTF value is checked to determine if it is greater than the standard. If the MTF value is greater than or equal to the standard, the capturing is completed; if the MTF value is lower than the standard, another capturing will be required.

According to an embodiment of the present invention, in the process of capturing imaging every time, environmental parameters for the shooting of the camera module, including the parameter of light and distance between the MTF testing chart and the camera module, are strictly controlled, so as to ensure the accuracy and consistency of imaging capturing for implementing subsequent adjusting steps.

According to an embodiment of the present invention, in the step (C2), a software applied to adjust the assembling position of the adjustable optical element is adaptable to be based research of sensibility of optical design of optical lens. The method of applying software to calculate the calibration measurement of assembling position of the adjustable optical element includes: (1) measuring optical characteristics of the camera module, including MTF value, eccentricity of the optic axis, tilt angle of the optic axis, and field curvature, before calibration; and (2) calculating the calibration measurement required by the assembling position of the adjustable optical element based on the sensibility of the eccentricity of the optic axis, tilt angle of the optic axis, and field curvature of the assembling position of the adjustable optical element respectively.

According to an embodiment of the present invention, in the step (A), by assembling the adjustable optical lens and the photosensitive device to achieve the fixed assembling for part of the optical elements comprised by the camera module, wherein the photosensitive device further comprises a filter, a lens mount, and a circuit board, wherein the filter is fixedly set on the lens mount, wherein the optical sensor is attached both on the top side of the circuit board and on the bottom side of the filter, wherein all elements of the adjustable optical lens besides of the adjustable optical element are fixed on the top side of the lens mount. In the process of the assembling and fixing, the assembling tolerances of the above elements are controlled within an allowable range.

According to an embodiment of the present invention, in the step (A), by assembling the adjustable optical lens and the photosensitive device to achieve the fixed assembling for part of the optical elements included by the camera module, wherein the photosensitive device further comprises a filter and a circuit board, wherein the filter is fixedly set on an optical structural member comprised by the adjustable optical lens and is on the bottom side of the optical lens, wherein the optical sensor is attached both on the top side of the circuit board and on the bottom side of the filter, wherein the optical structural member is affixed correspondingly to the spatial distance between the optical sensor. In the process the assembling and fixing, the assembling tolerances of the above elements are controlled within an allowable range.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Figure 1:
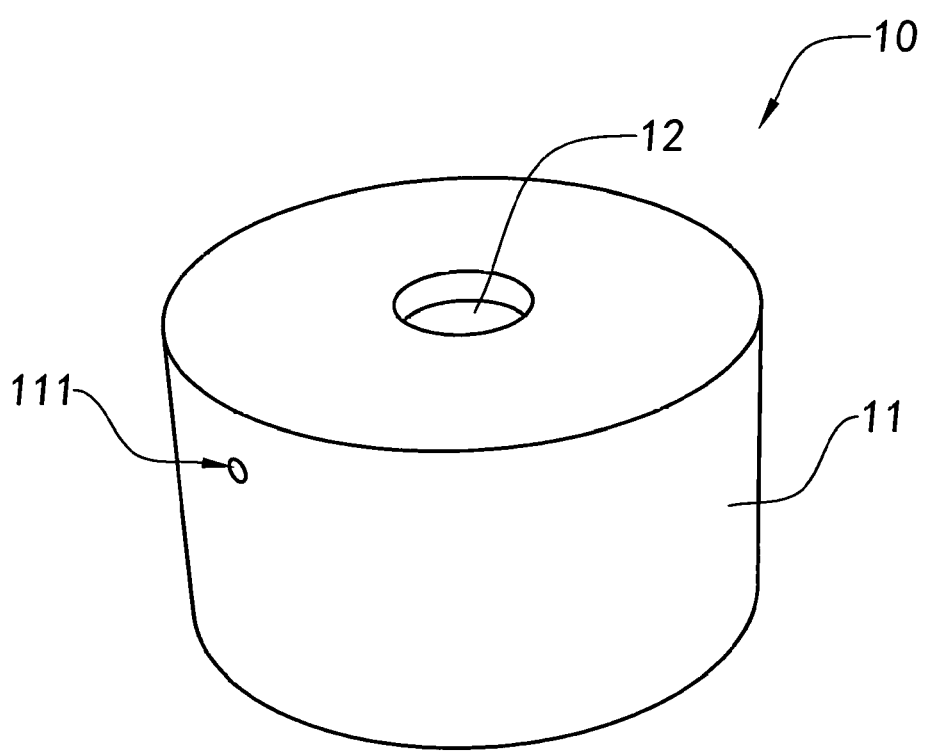
FIG. 1 is a perspective view of an adjustable optical lens according to a preferred embodiment of the present invention.
Figure 2:
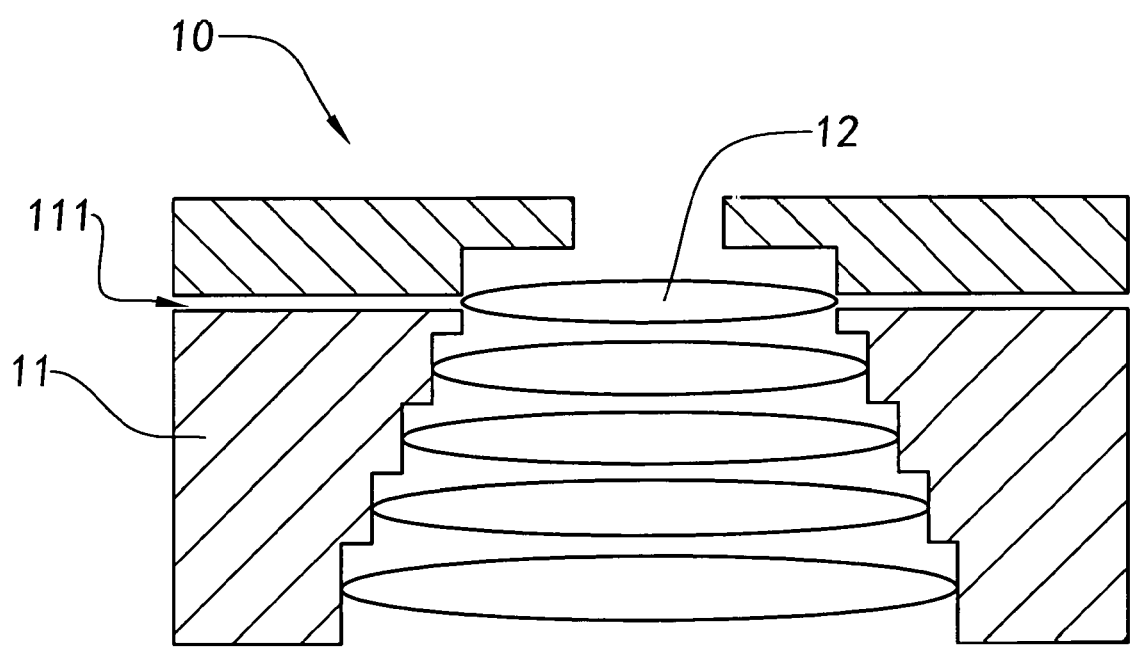
FIG. 2 is a sectional view of the adjustable optical lens according to the above preferred embodiment of the present invention.

Referring to FIG. 1 and FIG. 2 of the drawings, an adjustable optical lens 10 according to a preferred embodiment of the present invention is illustrated. A central axis line of the adjustable optical lens 10 is able to be adjusted again after the adjustable optical lens 10 has been produced, so that when the adjustable optical lens 10 is subsequently applied to an imaging system, the central axis line of the adjustable optical lens 10 can be adjusted based on specific parameters of the imaging system. Specifically, the adjustable optical lens 10 comprises an optical structural member 11 and two or more lens 12. Each of the lens 12 is arranged in an internal space of the optical structural member 11 along an axial direction of the optical structural member 11, wherein position of at least one of the lens 12 in the internal space of the optical structural member 11 is arranged in an adjustable configuration. By this way, the central axis line of the adjustable optical lens 10 is arranged to be adjustable based on the application needs of the imaging system after the adjustable optical lens 10 is produced.

Furthermore, the optical structural member 11 of the adjustable optical lens 10 has at least one adjustment channels 111. Each of the adjustment channels 111 are respectively adapted to communicate the internal space of the optical structural member 11 with an external environment. When the lens 12 are all overlappingly and spacedly arranged in the internal space of the optical structural member 11 along the axial direction of the optical structural member 11, an outer wall of each of the lens 12 is arranged on a position corresponding to the adjustment channels 111. Therefore, the positions of the lens 12 in the internal space of the optical structural member 11 can be adjusted later from the external environment of the optical structural member 11 through the adjustment channels 111, which is able to achieve the adjustment of the central axis line of the adjustable optical lens 10.

Those skilled in the art should know that the above disclosed structure of the adjustable optical lens 10 uses an example that the theories of the adjustable optical lens 10 can be described by adjusting the position of the outermost lens 12 in the internal space structural member 11. Specifically, according to the above mentioned preferred embodiment, the adjustable optical lens 10 comprises an optical structural member 11 and multiple lens 12 overlappingly and spacedly arranged in the internal space of the optical structural member 11, wherein the optical structural member 11 has one adjustment channel 111. The outermost lens 12 in the internal space of the optical structural member 11 is located at a position corresponding to the adjustment channel 111. Meanwhile, the lens 12 does not connect with the inner wall of the optical structural member 11, so that the position of the lens 12 in the internal space of the optical structural member 11 can be adjusted. In other words, a gap is formed between the outer wall of the lens 12 and the inner wall of the optical structural member 11, wherein the size of the gap can be greater than or equal to 3 micrometers. An end of an adjustment element is applied to insert from outside of the optical structural member 11 into the adjustment channel 111 and is extended to the internal space of the optical structural member 11, so as to push against the outer wall of the lens 12, and then the position of the lens 12 in the internal space of the optical structural member 11 can be adjusted, and the central axis line of the adjustable optical lens 10 can be adjusted. After the central axis line of the adjustable optical lens 10 is adjusted, the position of lens 12 and optical structural member 11 are fixed again. For example, the positions of lens 12 and optical structural member 11 can be fixed by a gluing process or a welding process, so as to ensure the reliability of the adjustable optical lens 10 while in use. Those skilled in the art may appreciate that the distance for the lens 12 to be adjusted in the internal space of the optical structural member 11 is equal to or smaller than the gap between the outer wall of the lens 12 and the inner wall of the optical structural member 11.

Although FIGS. 1 and 2 of the drawings show that the lens 12 in the internal space of the optical structural member 11 is able to be adjusted by arranging the adjustment channels 111 on the optical structural member 11 of the adjustable optical lens 10, those skilled in the art should understand that any other possible methods that can be used to adjust the relative position of the lens 12 in the internal space of the optical structural member 11 can be applied and shall be considered modified implementation according to the adjustable optical lens 10 of the present invention.

Figure 3:
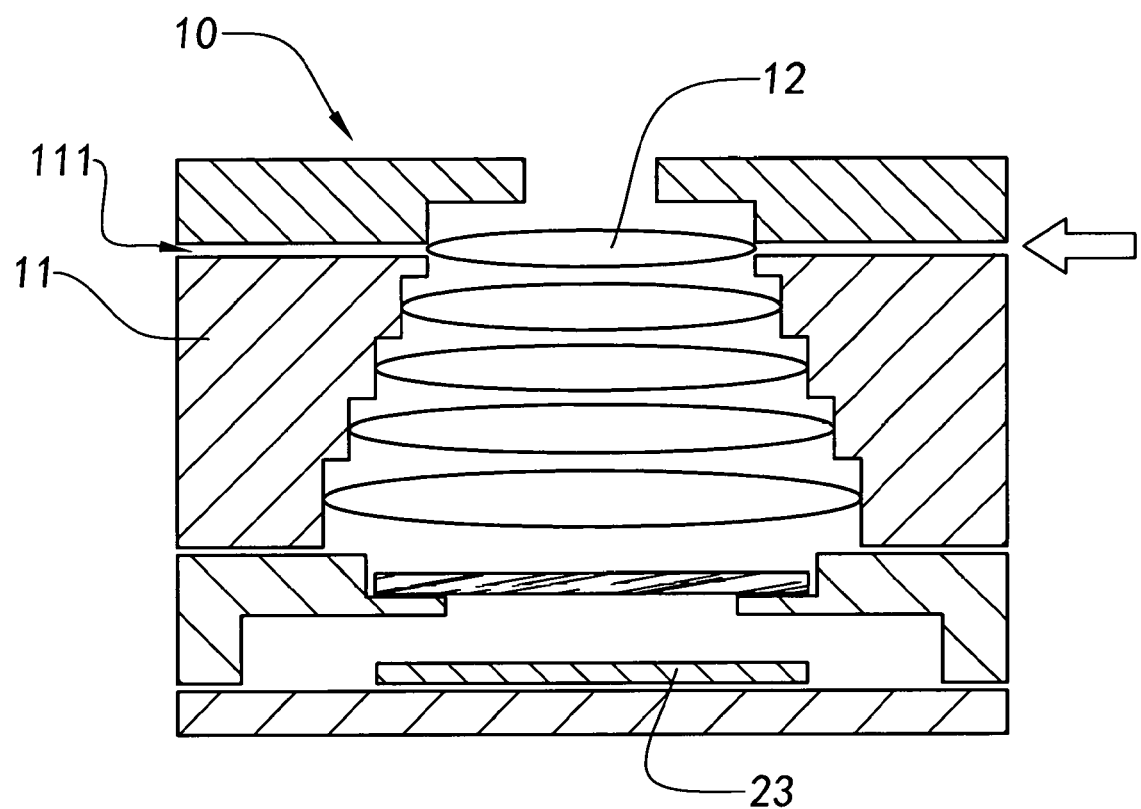
FIG. 3 is a first perspective view of a manufacturing process of the camera module according to the above preferred embodiment of the present invention.

Referring to FIG. 3 of the drawings, the present invention also comprises a camera module which comprises the adjustable optical lens 10. The camera module further comprises an optical sensor 20 such as a photosensitive chip. The adjustable optical lens 10 is installed above the optical sensor 20, so that lights reflected from an object may enter the inside of the camera module from the adjustable optical lens 10 and then be received by the optical sensor 20 to proceed photoelectric conversion, so that the camera module can subsequently generate images related to the object.

Referring to FIG. 3 of the drawings, according to the above mentioned preferred embodiment of the present invention, a manufacturing method of the camera module is illustrated. In this manufacturing method, at first, the adjustable optical lens 10 is arranged in the photosensitive path of the optical sensor 20. Because a certain deviation may exist in the manufacturing method of the camera module, the central axis line of the adjustable optical lens 10 cannot be accurately controlled. Therefore, after the adjustable optical lens 10 is arranged in the photosensitive path of the optical sensor 20, the central axis line of the adjustable optical lens 10 and the central axis line of the optical sensor 20 are coincided by adjusting the position of the lens 12 in the internal space of the optical structural member 11. And then, the adjustable optical lens 10 and the optical sensor 20 are packaged to complete the manufacturing method of the camera module. Those skilled in the art can understand that the central axis line of the adjustable optical lens 10 and the central axis line of the optical sensor 20 in the present invention are coincided, wherein a deviation between the central axis line of the adjustable optical lens 10 and the central axis line of the optical sensor 20 are controlled within an acceptable range, so that the yield rate of the camera module can be increased and the image quality of the camera module is guaranteed.

It is worth mentioning that in the step of adjusting the central axis line of the adjustable optical lens 10, the central axis line of the adjustable optical lens 10 can be adjusted not only by changing a horizontal position of the lens 12 in the internal space of the optical structural member 11, but also by changing a tilt position of the lens 12 in the internal space of the optical structural member 11. Furthermore, in another embodiment of the present invention, a vertical position of the lens 12 in the internal space of the optical lens 11 can also be adjusted based on the application needs of the camera module. Therefore, a structure design of the camera module becomes more flexible.

Figure 4:
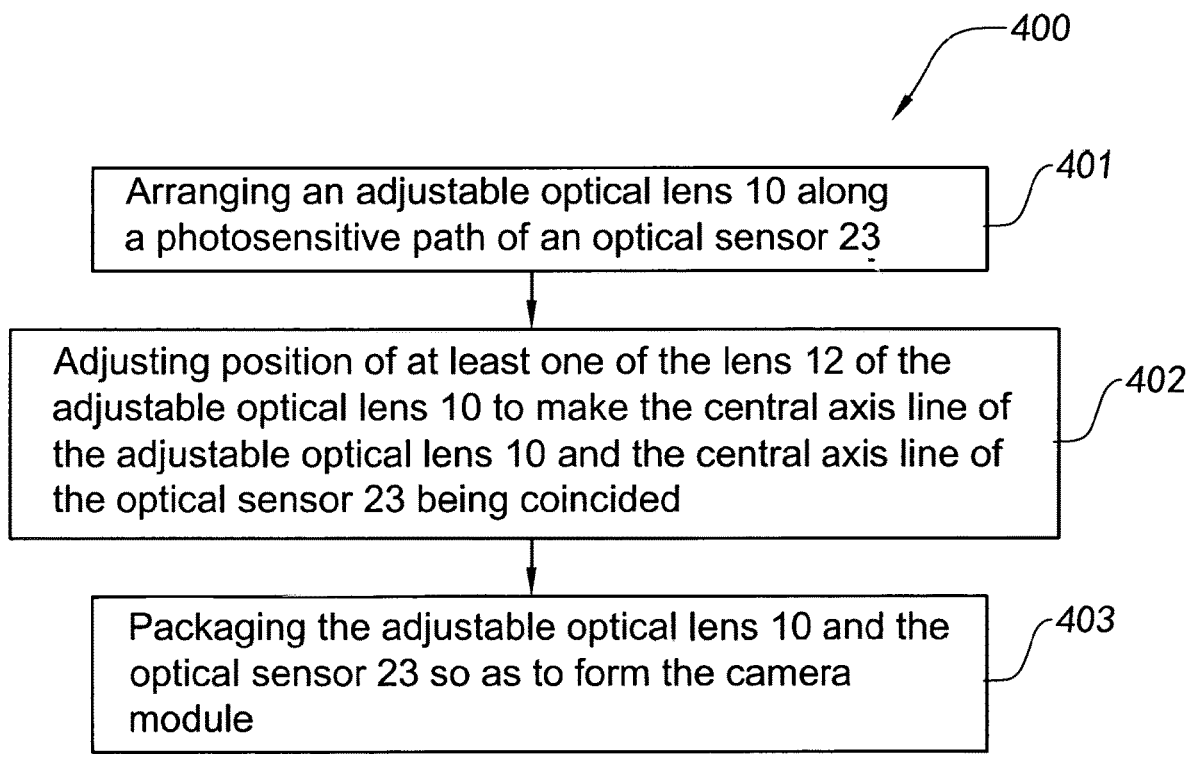
FIG. 4 is a flow diagram of a manufacturing method of the camera module according to the above preferred embodiment of the present invention.

As shown in FIG. 4, the present invention also comprises a manufacturing method 400 of a camera module, wherein the manufacturing method 400 comprises the following steps:

step (401): arranging an adjustable optical lens 10 along a photosensitive path of an optical sensor 20;

step (402): adjusting position of at least one of the lens 12 of the adjustable optical lens 10 to make the central axis line of the adjustable optical lens 10 and the central axis line of the optical sensor 20 being coincided; and step (403): packaging the adjustable optical lens 10 and the optical sensor 20 so as to form the camera module.

Further, in the step (402), the central axis line of the adjustable optical lens 10 and the central axis line of the optical sensor 20 are coincided by adjusting the position of the lens 12 at the outermost of the adjustable optical lens 10. It is worth mentioning that position of the lens 12 of the adjustable optical lens 10 in the internal space of the optical structural member 11 is able to be adjusted in at least one direction, for example, a horizontal direction. Preferably, each of the direction of the horizontal direction, vertical direction, and tilt direction of the lens 12 of the adjustable optical lens 10 in the internal space of the optical structural member 11 can be adjusted. Therefore, image qualities of the camera module generated from the adjustable optical lens 10 can be guaranteed. Besides, in another preferred embodiment of the present invention, at least one of the lens 12 in the internal space of the optical structural member 11 can be adjusted to rotate, so as to fulfill the application needs for packaging different types of camera module.

Further, in the step (402), after the position of the lens 12 in the internal space of the optical structural member 11 is adjusted, the adjusted lens 12 and optical structural member 11 are packaged. Therefore, the step for packaging the adjustable optical lens 10 and the optical sensor 20 is able to prevent deviation generated between the adjusted optical lens, so as to guarantee the image quality of the camera module.

Furthermore, in the above mentioned method, a sidewall of the optical structural member 11 has at least an adjustment channel 111 formed on positions which is corresponding to the lens 12 arranged in the internal space of the optical structural member 11, so that the position of the lens 12 in the internal space of the optical structural member 11 from the external environment of the optical structural member 11 is able to be adjusted through the adjustment channel 111.

Figure 5:
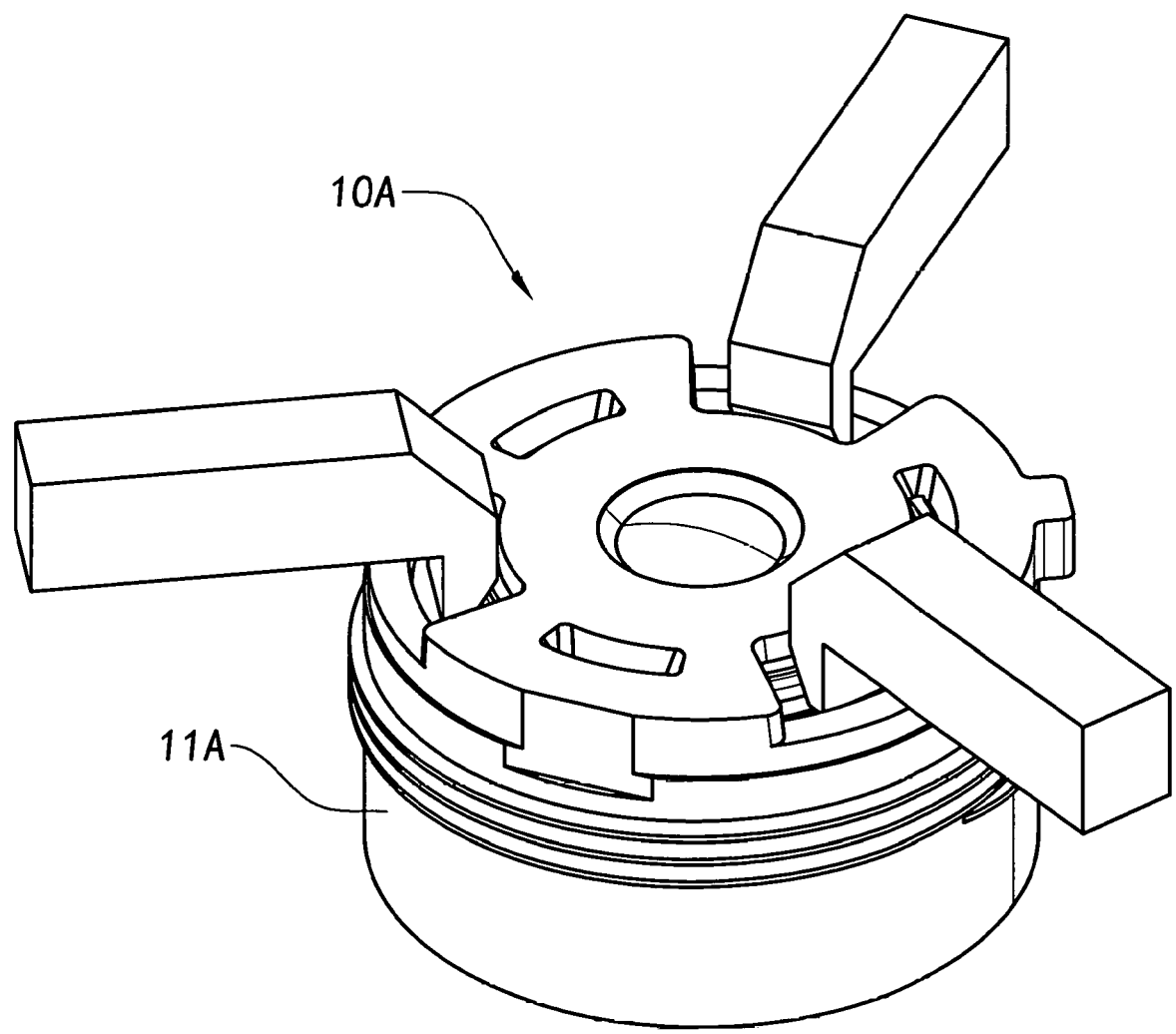
FIG. 5 is a perspective view of an optical structural member of an adjustable optical lens according to another preferred embodiment of the present invention.

Referring to FIG. 5 of the drawings, an adjustable optical lens 10A according to a second preferred embodiment of the present invention is illustrated, wherein the adjustable optical lens 10A comprises an optical structural member 11A and at least two lens 12A. At least one of the lens 12A is adjustably installed in the optical structural member 11A. Contrasting to conventional optical lens, the optical structural member 11A of the adjustable optical lens 10A of the present invention is separately arranged from at least one of the lens 12A. Besides, the adjustable optical lens 10A and an optical sensor 20A such as a photosensitive chip are packaged to produce a camera module. The lens 12A is installed in the optical structural member 11A based on the corresponding relation between the central axis line of the adjustable optical lens 10A and the central axis line of the optical sensor 20A. Accordingly, image qualities of the camera module formed of the adjustable optical lens 10A can be improved.

According to the above preferred embodiment of the present invention, each lens 12A can be installed in the optical structural member 11A based on the corresponding relation between the central axis line of the adjustable optical lens 10A and the central axis line of the optical sensor 20A, and then the adjustable optical lens 10A and an optical sensor 20A are packaged to produce the camera module. In another preferred embodiment of the present invention, the lens 12A at the outermost of the adjustable optical lens 10A can be installed in the optical structural member 11A based on the corresponding relation between the central axis line of the adjustable optical lens 10A and the central axis line of the optical sensor 20A, and then the adjustable optical lens 10A and the optical sensor 20A are packaged to produce the camera module.

After the lens 12A is installed in the optical structural member 11A, the lens 12A and the optical structural member 11A are solidified. Therefore, image qualities of the manufactured camera module can be improved.

Figure 6:
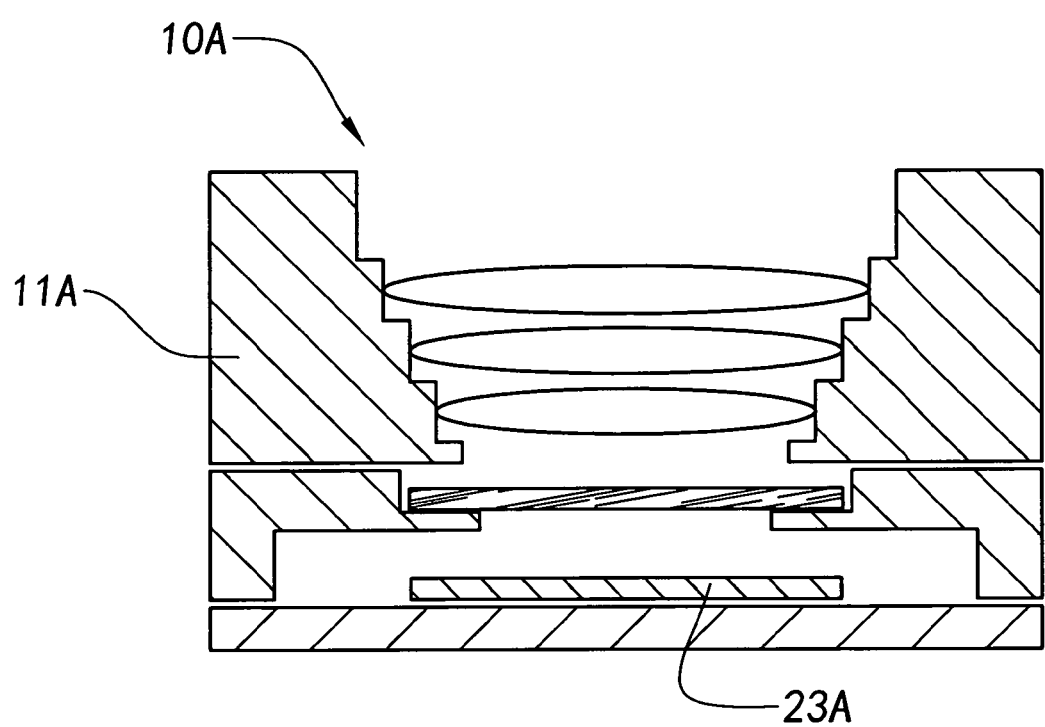
FIG. 6 is a first perspective view of a manufacturing process of the camera module according to the above another preferred embodiment of the present invention.
Figure 7:
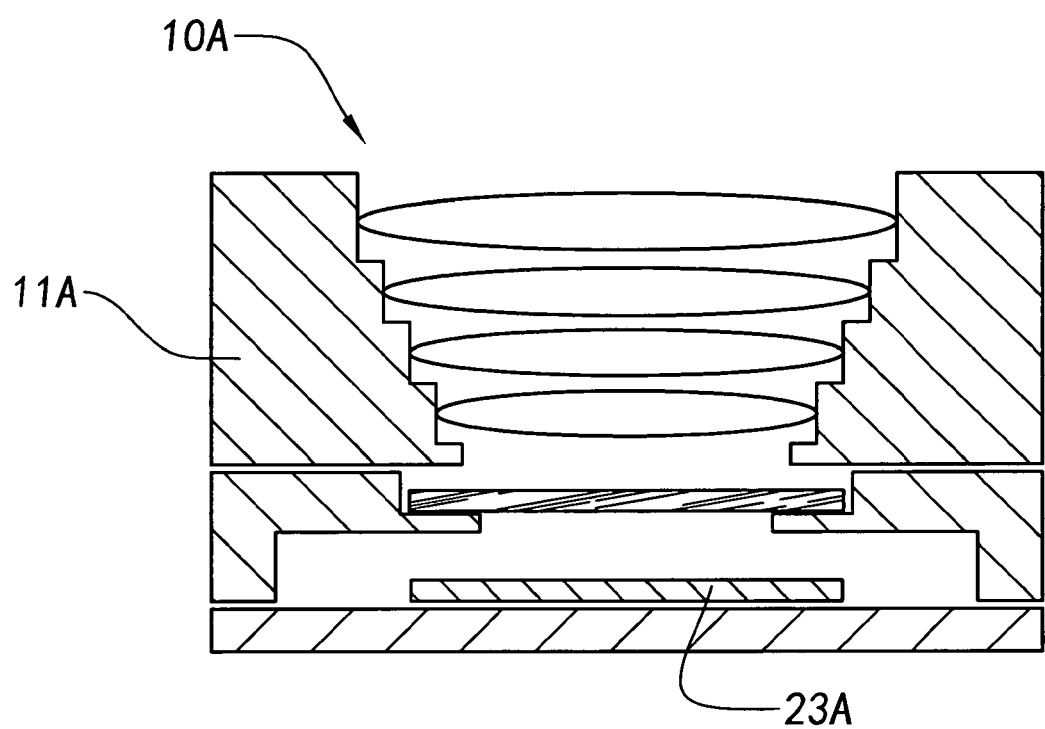
FIG. 7 is a second perspective view of a manufacturing process of the camera module according to the above another preferred embodiment of the present invention.

FIGS. 6 and 7 illustrates manufacturing flow of the camera module according to the above preferred embodiment of the present invention, wherein the camera module can not only be a prime lens camera module, but also can be an auto-focus lens camera module. The difference between the prime lens camera module and the auto-focus lens camera module is that the adjustable optical lens 10A of the prime lens camera module is directly packaged on a lens mount for connecting the adjustable optical lens 10A and a photosensitive device, wherein the photosensitive device comprises at least one optical sensor 20A. Preferably, the photosensitive device may also comprise a circuit board attached by the optical sensor 20A. The adjustable optical lens 10A of the auto-focus lens camera module is installed with a driver, such as a voice coil motor, and then the driver is installed on the lens holder, so that when the auto-focus lens camera module is in use, the adjustable optical lens 10A can be driven by the driver for moving along the photosensitive path of the optical sensor 20A, which is defined as an offset movement of the optical sensor 20A.

No matter in the manufacturing method of the auto-focus lens camera module or of the prime lens camera module, the optical structural member 11A can be installed along the photosensitive path of the optical sensor 20A before that the lens 12A is installed in the optical structural member 11A. Also, after the position of the lens 12A in the internal space of the optical structural member 11A is adjusted, the central axis line of the adjustable optical lens 10A and the central axis line of the optical sensor 20A are coincided. Therefore, image qualities of the camera module can be improved. It is worth mentioning that after the lens 12A is arranged in the optical structural member 11A, the central axis line of the adjustable optical lens 10A and the central axis line of the optical sensor 20A are coincided, and then the lens 12A and the optical structural member 11A are affixed. In some embodiments, for example, the lens 12A and the optical structural member 11A are affixed by a glue dispensing process.

Figure 8:
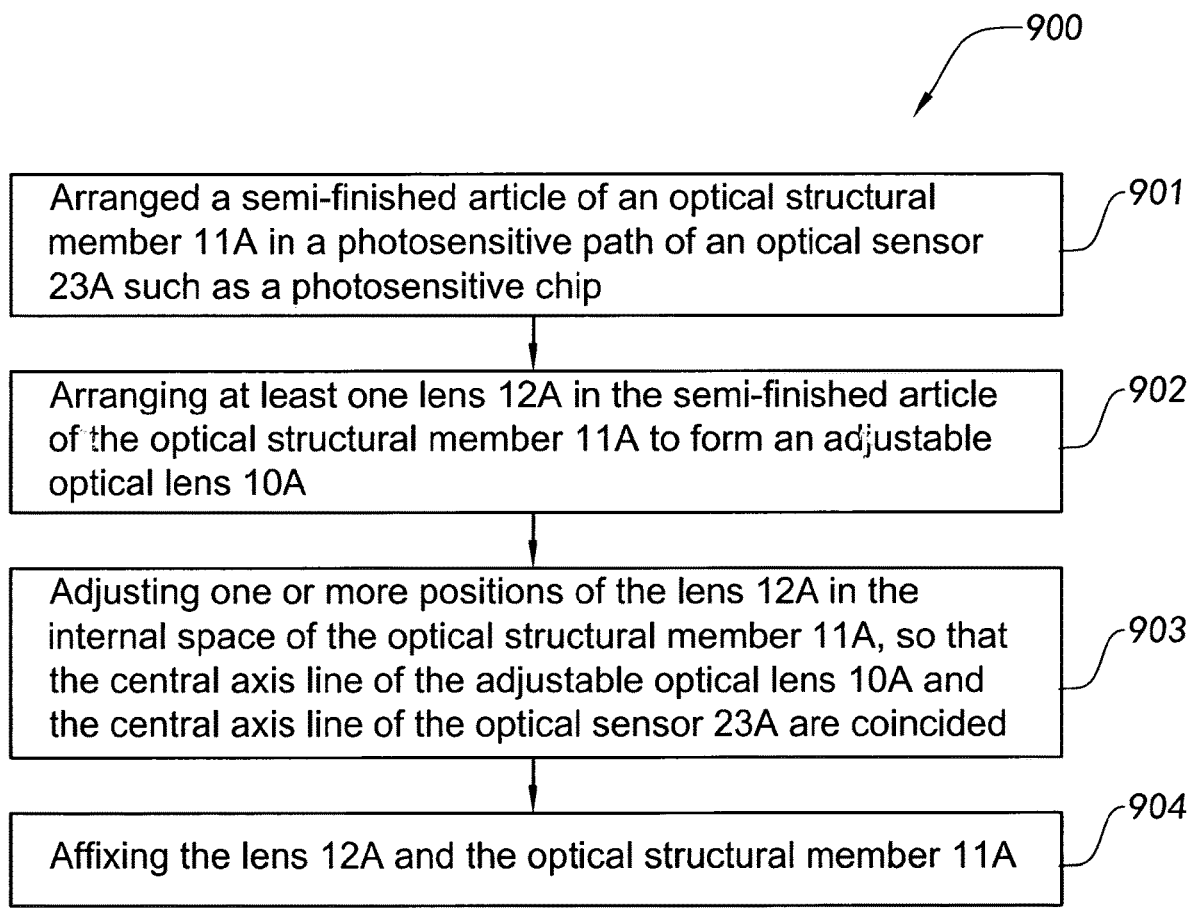
FIG. 8 is a flow diagram of a manufacturing method of the camera module according to the above another preferred embodiment of the present invention.

As shown in FIG. 8, another manufacturing method 900 of a camera module according to the above preferred embodiment of the present invention is illustrated, wherein the manufacturing method 900 comprises the following steps:

step (901): arranged a semi-finished article of an optical structural member 11A in a photosensitive path of an optical sensor 20A such as a photosensitive chip;

step (902): arranging at least one lens 12A in the semi-finished article of the optical structural member 11A to form an adjustable optical lens 10A; and step (903): adjusting one or more positions of the lens 12A in the internal space of the optical structural member 11A, so that the central axis line of the adjustable optical lens 10A and the central axis line of the optical sensor 20A are coincided.

Further, after the step (903), the manufacturing method 900 of a camera module further comprises the following steps:

step (904): affixing the lens 12A and the optical structural member 11A. It is worth mentioning that, in a preferred embodiment of the present invention, the lens 12A and the optical structural member 11A are affixed by a glue dispensing process.

Further, according to the above mentioned preferred embodiment of the present invention, in the step (901), the optical structural member 11A is arranged in the photosensitive path of the optical sensor 20A. Also, in the step (902), each of the lens is overlappingly and spacedly arranged in the internal space of the optical structural member 11A along the axial direction of the optical structural member 11A. In another embodiment of the present invention, the semi-finished article of the optical structural member 11A arranged in the photosensitive path of the optical sensor 20A, in the step (901), comprises an optical structural member 11A and at least a lens 12A which are preassembled in the internal space of the optical structural member 11A, and the rest of the lens 12A are arranged in the internal of the optical structural member 11A to form the adjustable optical lens 10A, in the step (902).

Figure 9:
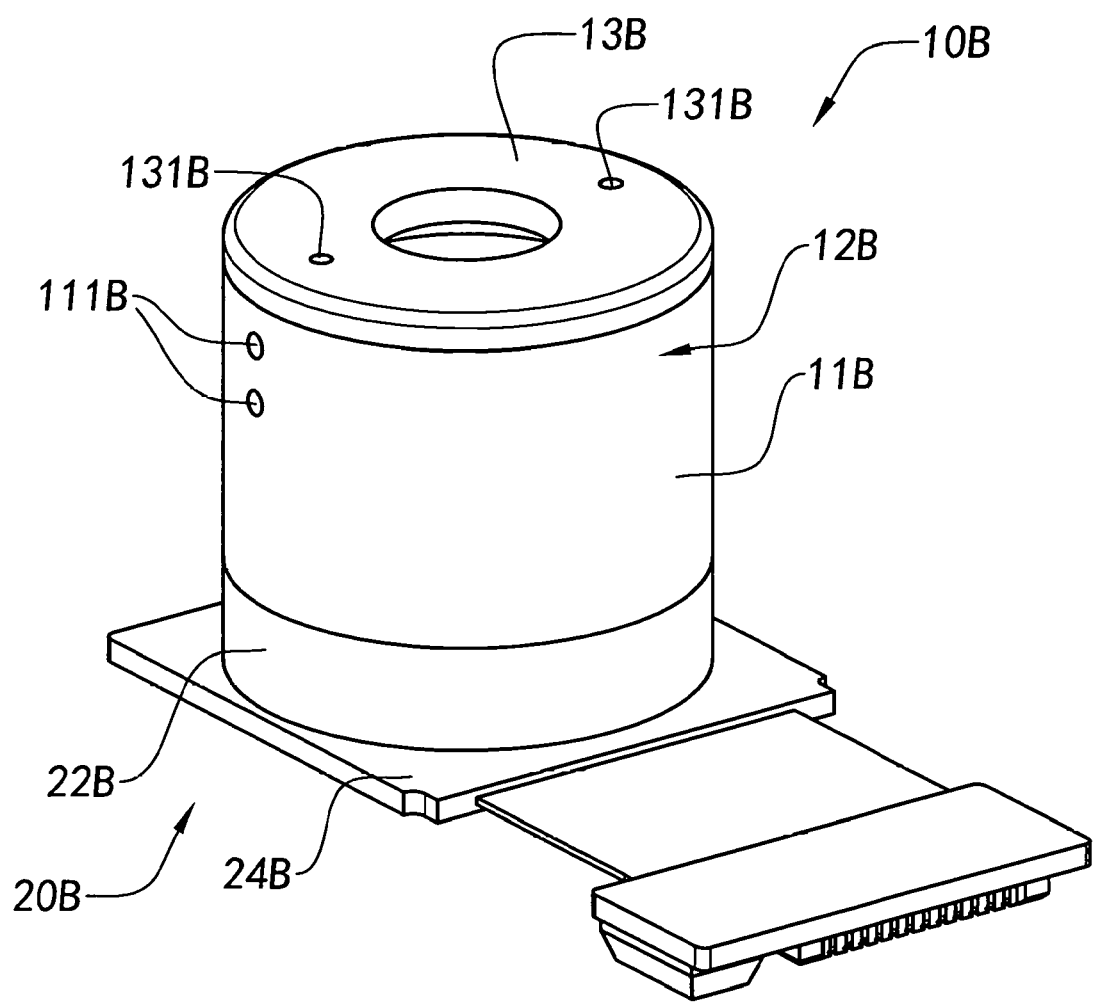
FIG. 9 is a perspective structural view of a camera module according to another preferred embodiment of the present invention.
Figure 10:
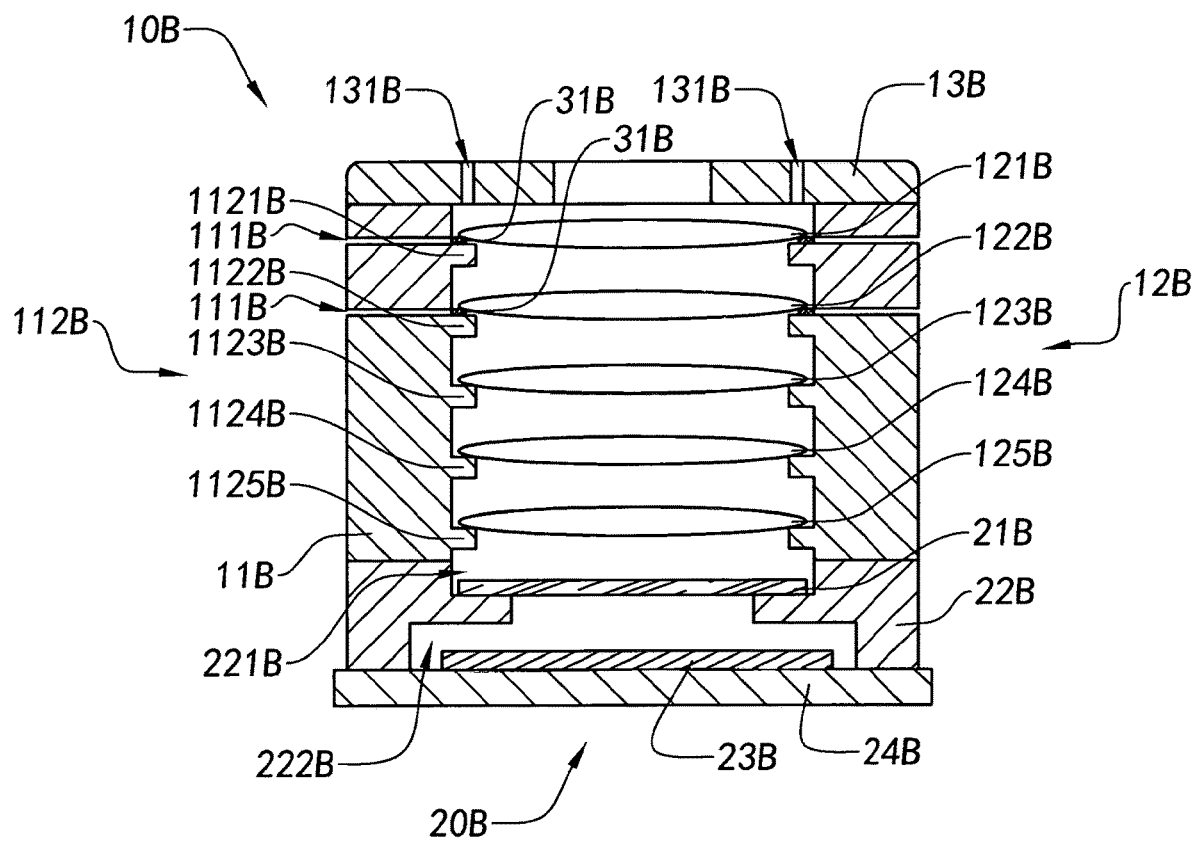
FIG. 10 is a sectional view of the camera module according to the above another preferred embodiment of the present invention.

Referring to FIG. 9 and FIG. 10, a camera module of an adjustable optical lens of a third preferred embodiment of the present invention will be described. As FIG. 9 and FIG. 10 show, a camera module comprises an adjustable optical lens 10B and a photosensitive device 20B. The adjustable optical lens 10B is installed in a photosensitive path of the photosensitive device 20B that lights reflected from an object enter the inside of the photosensitive device 20B from the optical lens 10B to be photoelectric converted, so that the camera module can subsequently generate images respective to the object.

The photosensitive device 20B comprises a filter 21B, a lens mount 22B, an optical sensor 23B, and a circuit board, wherein the filter 21B is fixed at a first groove 221B arranged on the upper part of the inner wall of the lens mount 22B and on the top of a photosensitive path of the optical sensor 23B. The optical sensor 23B is fixed at a second groove 222B arranged on the lower part of the inner wall of the lens mount 22B. The optical sensor 23B is attached on the top side of the circuit board 24B. The circuit board 24B is fixed at the bottom part of the lens mount 22B. That is, the filter 21B, the optical lens 22B, the optical sensor 23B, and the circuit board 24B have finished the assembling and fixing among one another and cannot be adjusted in successive calibration. Lights reflected from an object may enter the inside of the camera module from the adjustable optical lens 10B and then be received by the optical sensor 23B to proceed photoelectric conversion, so that the camera module can subsequently generate images respective to the object.

The adjustable optical lens 10B comprises an optical structural member 11B and at least a lens 12B. The lenses 12B are respectively installed in the optical structural member 11B along an axial direction of the optical structural member 11B. The optical structural member 11B is connected to the top portion of the lens mount 22B and have the lenses 12B in a photosensitive path of the optical sensor 23B. At least one of the lenses 12B is preassembled inside of the optical structural member 11B. The lens 12B preassembled inside of the optical structural member 11B is the adjustable optical element in the present preferred embodiment, which means that it is adaptable to be adjusted in the spatial position inside of the optical structural member 11B, wherein the optical lens formed thereof is called adjustable optical lens.

In the present preferred embodiment, five of the lenses 12 are comprised, which are respectively first lens 121B, second lens 122B, third lens 123B, fourth lens 124B and fifth lens 125B. Five of the lenses 12 are orderly overlappingly installed in the inside of the optical structural member 11B along a photosensitive path of the optical sensor 23B, wherein the third lens 123B, the fourth lens 124B, and the fifth lens 125B have already been preassembled in the optical structural member 11B and been fixed. The first lens 121B and the second lens 122B are preassembled into the optical structural member 11B as adjustable optical elements to be adjusted for calibration in the subsequent process, so as to increase imaging qualities of the camera module.

Optionally, some optical lenses of the five optical lenses are all fixed optical lenses, while the other optical lenses are the adjustable optical element. Optical lenses that comprise adjustable optical element are called adjustable optical lens. Before packaging the adjustable optical lens 10B and the photosensitive device 20B, assembling positions of the adjustable optical elements are adaptable to be adjusted.

Specifically, adhesive 31B is applied to orderly preassemble the second lens 122B and the first lens 121B into the optical structural member 11B. The adhesive 31B will not be completely solidified. That is, the adhesive 31D will be half solidified to conduct the preassembling of the first lens 121B and the second lens 122B, which not only prevents them from over moving, but also make successive adjusting easier.

The adhesive 31B applied a mixed adhesive of an UV adhesive and a thermosetting adhesive, which become half solidified after ultraviolet exposure to achieve the preassembling. After heating process, the adhesive 31B will be completely solidified, to fix the first lens 121B and the second lens 122B, so as to fix the whole camera module.

The adjustable optical lens 10B further comprises a diaphragm 13B. The diaphragm 13B is connected to the top of the optical structural member 11B for introducing incident light beam and limiting the volume of the incident light beam. In the present preferred embodiment, after the second lens 122D and the first lens 121B were orderly preassembled into the optical structural member 11B, the diaphragm 13 was fixedly installed on the top of the optical structural member 11B, on top of the first lens 121B, and in a photosensitive path of the optical sensor 23B. The central axis line of the diaphragm 13B and the central axis line of the optical sensor 23B coincided or were kept within an allowable range of deviation, so as to guarantee imaging qualities of the camera module.

It is worth mentioning that there are at least two adjustment channels 111B on the optical structural member 11B to connect the internal space of the optical structural member 11B to the external environment and to be respectively corresponding to the first lens 121B and the second lens 122B, so as to adjust the spatial positions of the first lens 121B and the second lens 122B in the internal space of the optical structural member 11B through the adjustment channels 111B. Preferably, the present embodiment applies six of the adjustment channels 111B, wherein three of the adjustment channels 111B are arranged on the sidewall of the optical structural member 111B along the preassembling position of the first lens 121B and separately arranged from one another at 120 degrees. The other three adjustment channels 111B are arranged on the sidewall of the optical structural member 111B along the preassembling position of the second lens 122B and separately arranged from one another at 120 degrees.

If the first lens 121B and the second lens 122B need to be adjusted, a needle can be inserted into the corresponding adjustment channel 111B. By controlling the needle to poke the first lens 121B and the second lens 122B, horizontal and vertical positions of the first lens 121B and the second lens 122B at the three spots of the corresponding adjustment channels 111B can be changed, so as to respectively conduct adjustings of the first lens 121B and the second lens 125D in any directions, including horizontal positions, vertical positions, and tilt positions.

In the present preferred embodiment, the optical structural member 11B can be implemented as a lens cone, wherein the inner wall of the optical structural member 11B spacingly has five limit structures 112B. The limit structures 112B are preferably protrudings formed by extending the inner wall of the optical structural member 11B toward the direction of cavity thereof, so as to respectively bear five of the lenses 12B. That is, the first limit structure 1121B, the second limit structure 1122B, the third limit structure 1123B, the fourth limit structure 1124B, and the fifth limit structure 1125B respectively bear the first lens 121B, the second lens 122B, the third lens 123B, the fourth lens 124B, and the fifth lens 125B. Those skilled in the art can understand that the optical structural member 11B can also apply other ways to bear each of the lenses 12B.

It is worth mentioning that the camera module can also comprise a driver and the optical structural member 11B can be a component of the driver.

In the present preferred embodiment, the camera module can not only be a prime lens camera module, but be a auto-focus lens camera module.

Figure 11:
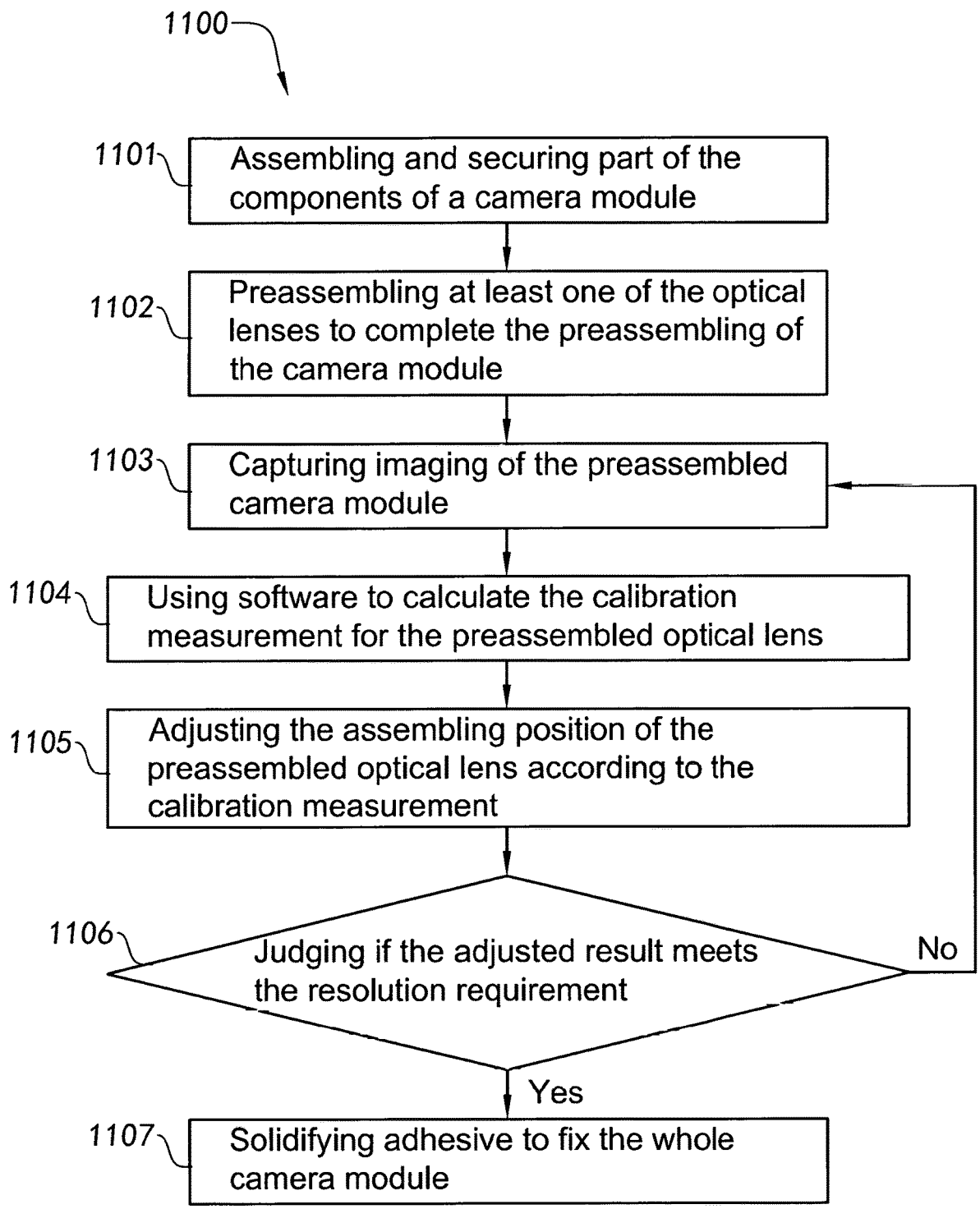
FIG. 11 is a flow diagram of a manufacturing method of the camera module according to the above another preferred embodiment of the present invention.

FIG. 11 is a flow diagram of a manufacturing method 1100 of the camera module of the present preferred embodiment, the manufacturing method 1100 of the camera module including the following steps:

step (1101): assembling and securing part of the components of a camera module;

step (1102): preassembling at least one of the optical lenses to complete the preassembling of the camera module;

step (1103): capturing imaging of the preassembled camera module;

step (1104): using software to calculate the calibration measurement for the preassembled optical lens;

step (1105): adjusting the assembling position of the preassembled optical lens according to the calibration measurement;

step (1106): proceeding step (1107) if the adjusted result meets the resolution requirement, or repeating steps (1103) to (1105) if the adjusted result fails to meet the resolution requirement, until the adjusting of the preassembled optical lens achieves the expected requirement; and step (1107): solidifying adhesive to fix the whole camera module.

In the step (1101), the filter 21B, the lens mount 22B, the optical sensor 23B, and the circuit board 24B are assembled and fixed to form the photosensitive device 20B. Also the optical structural member 11B is assembled and fixed on the lens mount 22B. The third lens 123B, the fourth lens 124B, and the fifth lens 125B are fixedly assembled at the corresponding limit structures 112B of the optical structural member 11B.

It is worth mentioning that in this step, assembling tolerances among each of the above elements should be controlled to the smallest to be kept within the allowable range of tolerance as long as possible, so as to avoid increases successive adjustment or failure of successive adjusting due to overly high assembling tolerance.

In the step (1102), the second lens 122B and the first lens 121B are orderly preassembled into the optical structural member 11B. Adhesive 31B is applied in the preassembling. The adhesive 31B is then half solidified under ultraviolet exposure to complete the preassembling of the second lens 122B and the first lens 121B. Nest, the diaphragm 13B is fixedly assembled on the top of the optical structural member 11B. At this point, the preassembling of the camera module is finished through the partial fixedly assembling, which makes the optical lens of the camera module become the adjustable optical lens 10D.

In the steps (1103) and (1104), the preassembled camera module is powered on and imaging of the camera module is captured. Then the calibration measurements for the assembling positions of the first lens 121B and the second lens 122B are respectively calculated based on the imaging of the camera module.

Capturing of the imaging of the camera module is based on shooting a MTF (Modulation Transfer Function) testing chart with the camera module. The MTF value is applied to represent the imaging quality of the camera module. A greater MTF value indicates a higher imaging quality of the camera module. Every time when the imaging of the camera module is captured, a MTF value corresponding to the imaging needs to be calculated. The MTF value is then checked to determine if it is greater than the standard. If the MTF value is greater than or equal to the standard, the capturing is completed; if the MTF value is lower than the standard, another capturing and adjusting will be required.

It should be noted that in the process of capturing imaging every time, the environmental parameters for the shooting of the camera module, including distance between the testing chart and the camera module and the parameter of light sources, should be strictly controlled, so as to ensure the accuracy and consistency of imaging capturing for adjusting the assembling position of the adjustable optical element.

In the process of imaging capturing of the camera module, besides of calculating MTF value, other characteristics of the camera module, including stained or defective pixel, artifact, vignetting, can also be monitored and checked.

How the software adjusting of the assembling position of the adjustable optical element is based on studies of the sensibility of optical design of lens system. Method of the software to calculate the calibration measurement of the assembling positions of the first lens 121B and the second lens 122B comprises the steps of:

measuring optical characteristics of the camera module, including MTF value, eccentricity of the optic axis, tilt of the optic axis, and field curvature before adjusting based on the imaging of the camera module; and calculating the calibration measurements for the assembling positions of the first lens 121B and the second lens 122B based on the sensibility of the optical characteristics of the assembling positions of the first lens 121B and the second lens 122B.

In the steps (1105) and (1106), based on the calculated calibration measurements of the step (1104), preassembling positions of the first lens 121B and the second lens 122B are respectively adjusted through corresponding adjustment channel 111B, so as to have the first lens 121B and the second lens 122B in the optical structural member 11B properly turn. That is to say, the first lens 121B and the second lens 122B are properly adjusted in the horizontal position, vertical or axial position, and tilting position thereof, such that after adjusting, the central axis lines of the first lens 121B and the second lens 122B and the central axis line of the optical sensor 23B are to coincide or within an allowable range of deviation. Meanwhile, imaging of the camera module after adjusting will meet the resolution requirement. If imaging of the camera module still fails to meet the resolution requirement after the adjustment, assembling positions of the first lens 121B and the second lens 122B should then further be adjusted.

Each adjusting requires a capturing of the imaging of the camera module, which means to repeat the step (1103) to (1105) until the imaging of the camera module meets the requirement.

It is worth mentioning that as the adjustable optical element is adjusted to the target position according to the calculated calibration measurement and the imaging of the camera module meets the resolution requirement, it can be considered that the central axis line of the adjustable optical lens 10B and the central axis line of the optical sensor 23B coincide or are within an allowable range of deviation, which means the adjusting satisfies the set requirement.

In the step (1107), solidifying the adhesive 31B through heating process fixes the first lens 121B and the second lens 122B in the optical structural member 11B. Then the adjustment channel 111B is sealed. The present embodiment preferably seals the adjustment channel 111B by injecting adhesive or glue dispensing into the adjustment channel 111B and then conducting heating process, or waiting to be heated with the adhesive 31B to solidify the adhesive for sealing the adjustment channel 111B and the adhesive 31B at the same time, which seals the adjustment channel 111B and fixes the first lens 121B and the second lens 122B simultaneously, so as to package the adjustable optical lens 10B and the photosensitive device 20B and then to fix the whole camera module.

Besides, in the step (1107) the present invention may set at least one adhesive injection channel 131B on the diaphragm 13B for injecting adhesive to further fixed the adjusted first lens 121B. An implementation can have two adhesive injection channels 131B that after the first lens 121B alone or both the first lens 121B and the second lens 122B are adjusted, thermosetting adhesive is injected into the adhesive injection channels 131B. After heating process of the camera module, the first lens 121B is further to be completely fixed. Meanwhile, the injected adhesive can also seal the injection channels 131B after solidification.

Figure 12:
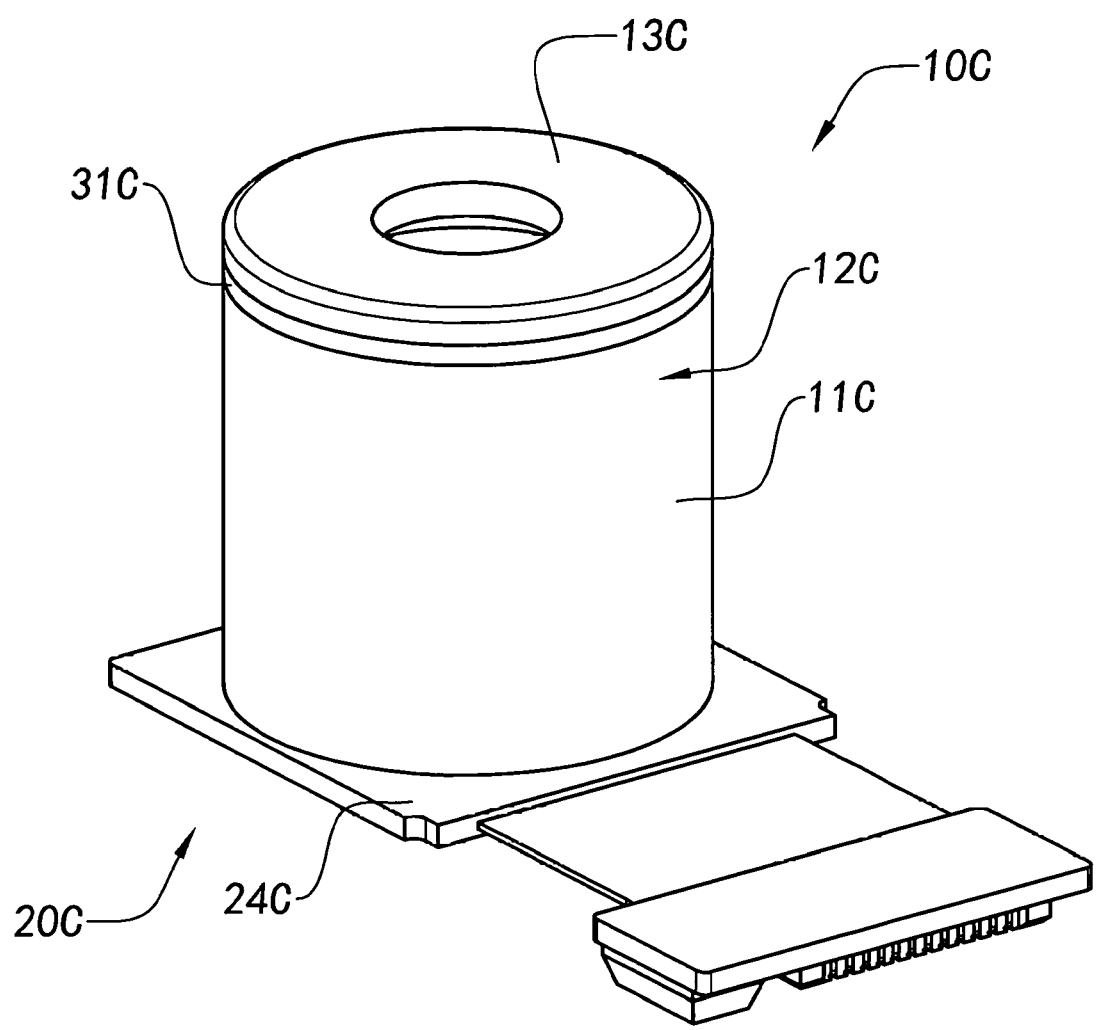
FIG. 12 is a perspective structural view of a camera module according to another preferred embodiment of the present invention.
Figure 13:
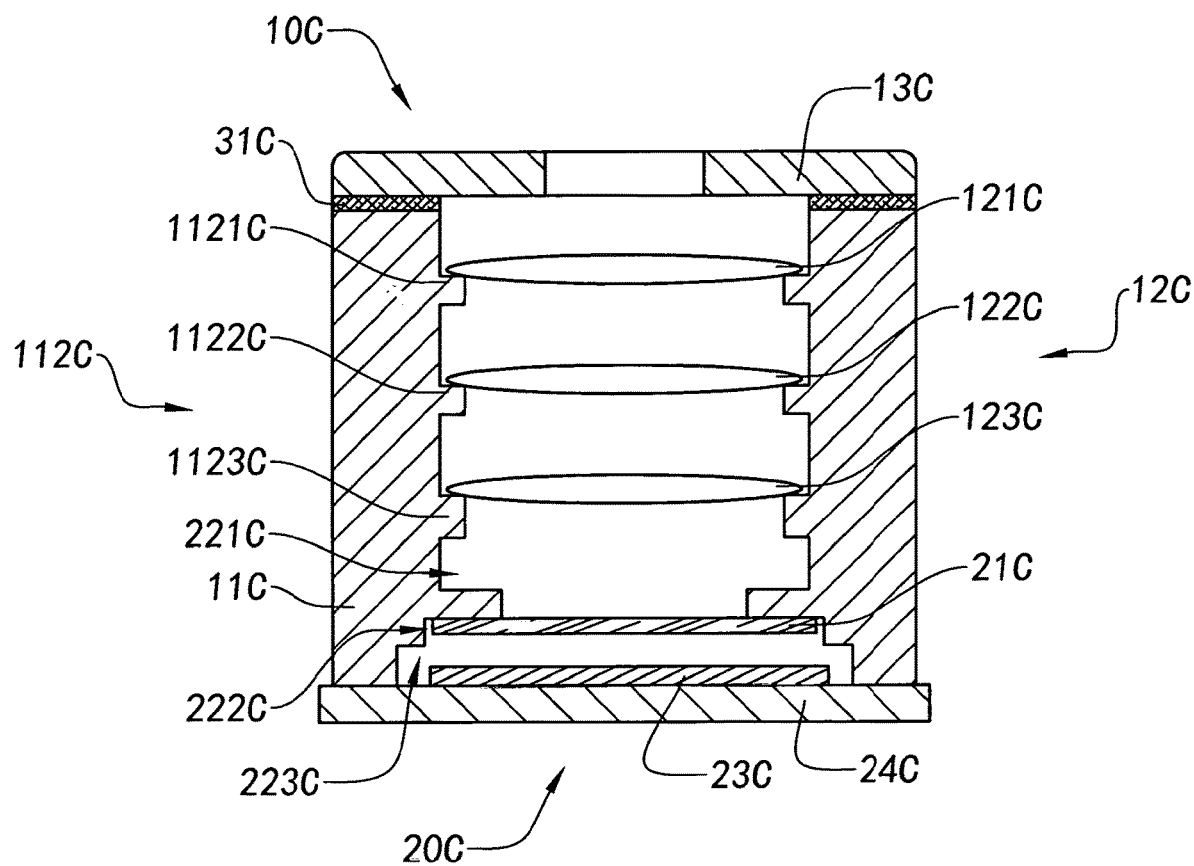
FIG. 13 is a sectional view of a camera module according to the above another preferred embodiment of the present invention.

Referring to FIG. 12 and FIG. 13, it is a camera module of a fourth preferred embodiment provided by the present invention. As FIG. 12 and FIG. 13 show, a camera module including an adjustable optical lens 10C and a photosensitive device 20C. The adjustable optical lens comprises an optical structural member 11C, three lenses 12C (which respectively are first lens 121C, second optical lens 122C, and third lens 123C), and a diaphragm 13C, wherein the three lenses 12C are installed inside of the optical structural member 11C along an axial direction of the optical structural member 11C and are fixed. The diaphragm 13C is preassembled on the top of the optical structural member 11C, which is also on top of the first lens 121C and kept a certain spacing therewith. The assembling position of the diaphragm 13C is able to be adjusted in at least one direction, such as X, Y, or Z direction, relative to the spatial position of the optical structural member 11C. In the present preferred embodiment, the diaphragm 13C is to be an adjustable optical element that a optical lens formed thereof becomes an adjustable optical lens. The photosensitive device 20C comprises a filter 21C, an optical sensor 23C, and a circuit board 24C, wherein the optical structural member 11C is also a lens mount of the photosensitive device 20C. The filter 21C is fixedly installed in the optical structural member 11C and is under the bottom of the third lens 123C. The optical sensor 23C is fixedly installed in the optical structural member 11C and attached on top of the circuit board 24C under the bottom of the filter 21C. The lenses 12C, the diaphragm 13C, and the filter 21C are in a photosensitive path of the optical sensor 23C, so lights reflected from an object may enter the inside of the camera module from the adjustable optical lens 10C and then be received by the optical sensor 23C to proceed photoelectric conversion, so that the camera module can subsequently generate images respective to the object.

Specifically, the inner wall of the optical structural member 11C forms a first groove 221C, a second groove 222C, and a third groove 223C, which are sequentially and spacingly set in the top, middle, and bottom of the optical structural member 11C. The filter 21C is installed in the second groove 222C. The optical sensor 23C is held in the third groove 223C and attached on the circuit board 24C on top of the circuit board 24C. The circuit board 24C is installed in the bottom portion of the optical structural member 11C.

The first lens 121C is fixedly installed at a first limit structure 1121C arranged on the inner wall of the optical structural member 11C. The second lens 122C is fixedly installed at a second limit structure 1122C arranged on the inner wall of the optical structural member 11C. The third optical lens is installed at a third limit structure 1123C arranged on the inner wall of the optical structural member 11C. The first limit structure 1121C, the second limit structure 1122C, and the third limit structure 1123C are protrudings formed by extending the inner wall of the optical structural member 11C toward the direction of the cavity thereof, to respectively bear the first lens 121C, the second lens 122C, and the third lens 123C.

Figure 14:
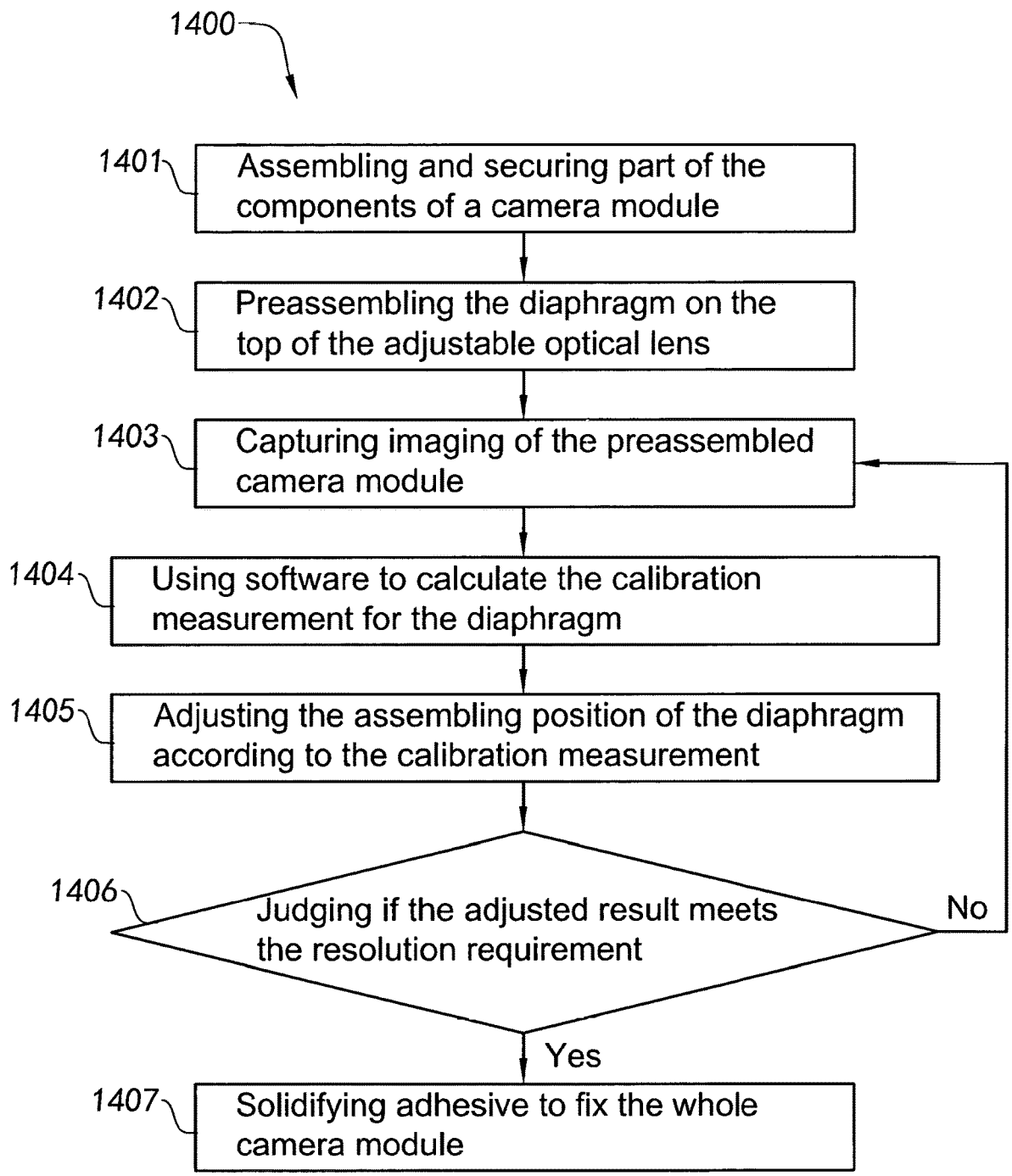
FIG. 14 is a flow diagram of a manufacturing method of the camera module according to the above another preferred embodiment of the present invention.

Referring to FIG. 14, a manufacturing method 1400 of the camera module of the present preferred embodiment comprises the following steps:

step (1401): assembling and securing part of the components of a camera module;

step (1402): preassembling the diaphragm 13C on the top of the adjustable optical lens 10C;

step (1403): capturing imaging of the preassembled camera module;

step (1404): using software to calculate the calibration measurement for the diaphragm 13C;

step (1405): adjusting the assembling position of the diaphragm 13C according to the calibration measurement;

step (1406): proceeding step (1407) if the adjusted result meets the resolution requirement, or repeating steps (1403) to (1405) if the adjusted result fails to meet the resolution requirement, until the adjusting of the diaphragm achieve the expected requirement; and step (1407): solidifying adhesive to fix the whole camera module.

In the step (1401), part of the module components of the camera module are assembled and fixed. That is, the filter 21C, the optical sensor 23C, and the circuit board 24C are installed and fixed at the designated positions of the optical structural member 11C. Also, the third lens 123C, the second lens 122C, and the first lens 121C are orderly installed and fixed at the designated positions in the optical structural member 11C, so that the three lenses 12C are in a photosensitive path of the optical sensor 23C, and that the central axis lines of the three lenses 12C and the central axis line of the optical sensor 23C coincide or are within an allowable range of deviation. Besides, assembling tolerances among each of the above components are strictly controlled to guarantee the imaging qualities of the camera module and to reduce the workload of future adjusting.

In the step (1402), the diaphragm 13C is preassembled on the top of the optical structural member 11C through the way of half solidifying the adhesive 31C, so as to have the diaphragm 13C in a photosensitive path of the optical sensor 23C and allow the diaphragm 13 to be adjusted in at least one direction relative to the spatial position of the optical sensor 23C or the optical structural member 11C. The adhesive 31C is preferably thermosetting adhesive that can be half solidified under ultraviolet exposure for preassembling.

In the steps (1403) to (1406), the preassembled camera module is powered on and imaging of the camera module is captured. Then the calibration measurement for the diaphragm 13C is calculated by the software based on the imaging of the camera module. Proper adjusting of the assembling position of the diaphragm 13C is conducted according to the calculated calibration measurement, so as to make the central axis line thereof and the central axis line of the optical sensor 23C coincide or be within an allowable range of deviation, which is to also make the central axis line of the adjustable optical lens 10C and the central axis line of the optical sensor 23C coincide or be within an allowable range of deviation. At this point, the imaging of the camera module meets the resolution requirement. If imaging of the camera module still fails to meet the resolution requirement after the diaphragm 13C has been adjusted, further capturing of the imaging of the camera module and new adjusting of the diaphragm 13C are needed until it is adjusted to an eligible position and then fixed.

In the step (1407), when the adjusting of the diaphragm 13C makes the imaging of the camera module meet the resolution requirement, the camera module will be heated, so as to completely solidify the adhesive 31C that attaches the diaphragm 13C to the optical structural member 11C, to then fix the whole camera module.

Figure 15:
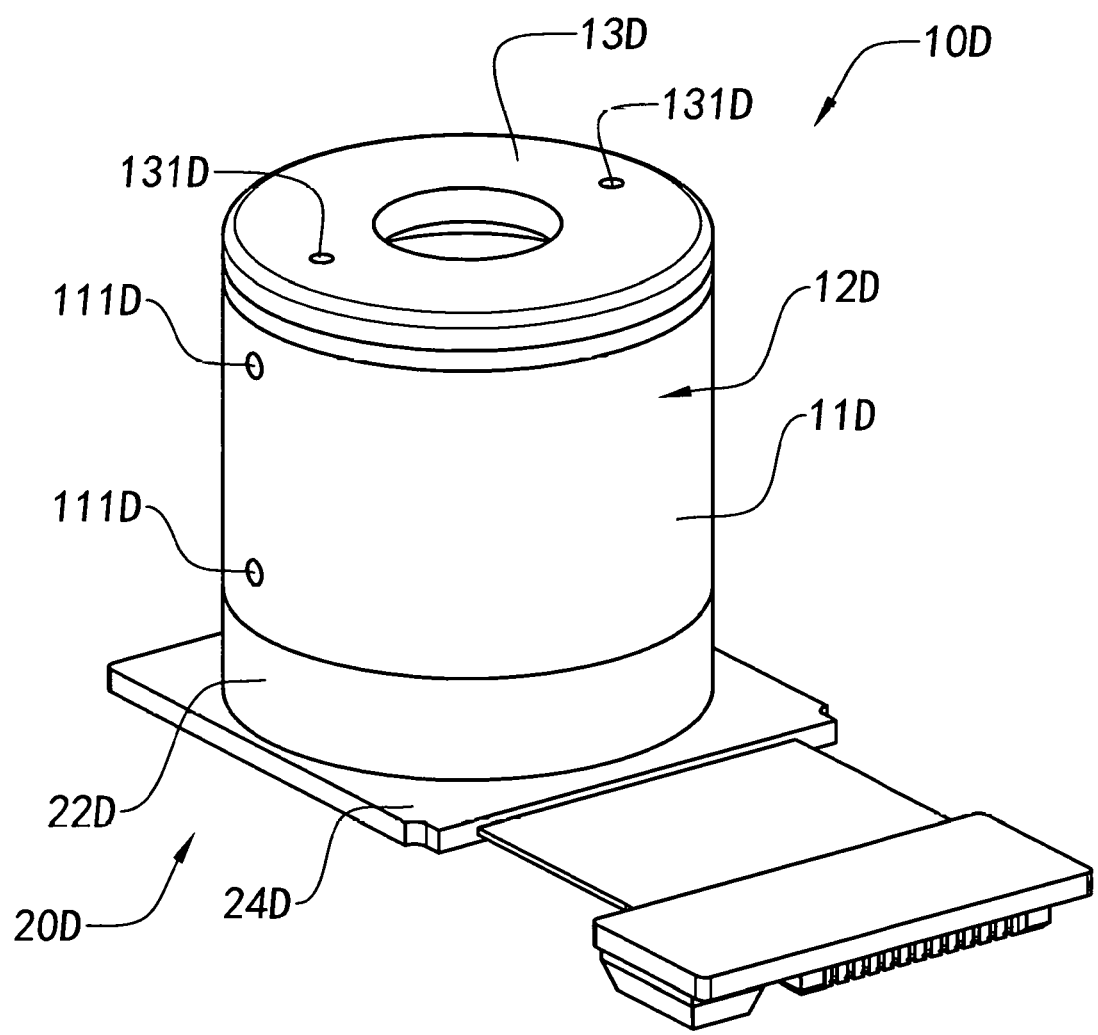
FIG. 15 is a perspective structural view of a camera module according to another preferred embodiment of the present invention.
Figure 16:
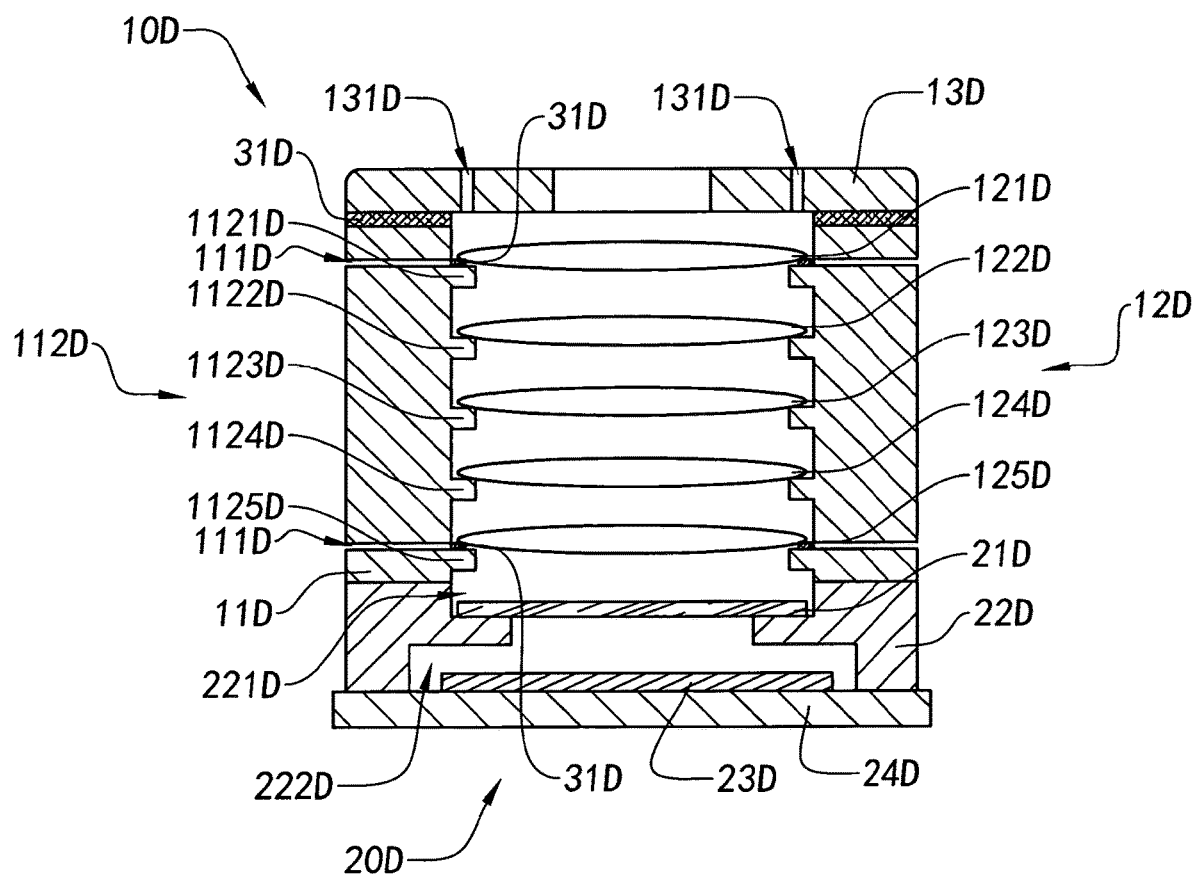
FIG. 16 is a sectional view of the camera module according to the above another preferred embodiment of the present invention.

Referring to FIG. 15 and FIG. 16, it is a fifth preferred embodiment of the present invention. As FIG. 15 and FIG. 16 show, a camera module comprises an adjustable optical lens 10D and a photosensitive device 20D. The adjustable optical lens 10D is installed in the path to photoreception of the photosensitive device 20D that lights reflected from an object enter the inside of the photosensitive device 20D from the optical lens 10D to be photoelectric converted, so that the camera module can then generate images respective to the object.

The photosensitive device 20D comprises a filter 21D, a lens mount 22D, an optical sensor 23D, and a circuit board, wherein the filter 21D is fixed at a first groove 221D arranged on the upper part of the inner wall of the lens mount 22D and on the top of a photosensitive path of the optical sensor 23D. The optical sensor 23D is fixed at a second groove 222D arranged on the lower part of the inner wall of the lens mount 22D. The optical sensor 23D is attached on the top side of the circuit board 24D. The circuit board 24D is fixed at the bottom part of the lens mount 22D. That is, the filter 21D, the optical lens 22D, the optical sensor 23D, and the circuit board 24D have finished the assembling and fixing among one another and cannot be adjusted in successive calibration. Lights reflected from an object may enter the inside of the camera module from the adjustable optical lens 10D and then be received by the optical sensor 23D to proceed photoelectric conversion, so that the camera module can subsequently generate images respective to the object.

The adjustable optical lens 10D comprises an optical structural member 11D and at least a lens 12D. The lenses 12D are spacingly installed inside of the optical structural member 11D along an axial direction of the optical structural member 11D. The optical structural member 11D is installed on the top portion of the lens mount 22D and have the lenses 12D in a photosensitive path of the optical sensor 23D. At least one of the lenses 12D is preassembled inside of the optical structural member 11D. The lens 12 preassembled inside of the optical structural member 11D is an adjustable optical element, which means that it is adaptable to be adjust in at least one direction in the optical structural member 11D, wherein the optical lens formed thereof is called adjustable optical lens.

In the present preferred embodiment, there are five of the lenses 12, which are respectively first lens 121D, second lens 122D, third lens 123D, fourth lens 124D, and fifth lens 125D. Five of the lenses 12 are orderly overlappingly and spacingly installed in the inside of the optical structural member 11D along a photosensitive path of the optical sensor 23D, wherein the second lens 122D, the third lens 123D, and the fourth lens 124D have been preassembled in the optical structural member 11D and been fixed that the positions thereof are not adjustable. The first lens 121D and the fifth lens 125D are preassembled into the optical structural member 11D as adjustable optical elements to be adjusted for calibration in the subsequent process, so as to increase imaging qualities of the camera module.

Optionally, some optical lenses of the five optical lenses are all fixed optical lenses, while the other optical lenses are the adjustable optical element. Optical lenses that comprise adjustable optical element are called adjustable optical lens. Before packaging the adjustable optical lens 10D and the photosensitive device 20D, assembling positions of the adjustable optical elements are adaptable to be adjusted.

Specifically, adhesive 31D is applied to orderly preassemble the first lens 121D and the fifth lens 125D into the optical structural member 11D. The adhesive 31D will not be completely solidified. That is, the adhesive 31D will be half solidified to conduct the preassembling of the first lens 121D and the fifth lens 125D, which not only prevents them from over moving, but also make successive adjusting easier.

The adjustable optical lens 10D further comprises a diaphragm 13D. Adhesive 31D is applied to preassemble the diaphragm 13D on the top of the optical structural member 11D for introducing incident light beam and limiting the volume of the incident light beam, wherein the assembling position of the diaphragm 13D is adaptable to be adjusted in at least one direction relative to the optical sensor 23D, which is mainly adjusting in horizontal direction, but adjusting in vertical direction and tilt direction are also possible.

In the present preferred embodiment, sequentially, the fifth lens 125D is preassembled, then the fourth lens 124D, the third lens 123D, and the second lens 122D are fixedly assembled, then the first lens 121D is preassembled in the optical structural member 11D, and then the diaphragm 13D is preassembled on the top of the optical structural member 11D. The diaphragm 13D is on top of the first lens 121D and also in a photosensitive path of the optical sensor 23D. Among the above, the first lens 121D, the fifth lens 125D, and the diaphragm 13D are adjustable optical elements that the assembling positions thereof are adaptable to be adjusted in at least one direction in the successive process of calibration or adjusting. The adjustable directions comprise horizontal direction, vertical direction, tilt direction, and peripheral direction. After adjusting, the central axis line of the adjustable optical lens and the central axis line of the optical sensor 23D are made to coincide or be within an allowable range of deviation, so as to have the imaging of the camera module achieve the resolution requirement and to guarantee imaging qualities of the camera module.

The adhesive 31D applied a mixed adhesive of an UV adhesive and a thermosetting adhesive, which becomes half solidified after ultraviolet exposure to achieve the preassembling. After heating process, the adhesive 31D will be completely solidified, to fix the whole camera module.

It is worth mentioning that there are at least two adjustment channels 111D on the optical structural member 11D to connect the internal space of the optical structural member 11D to the external environment and to be respectively corresponding to the adjustable optical elements. In the present preferred embodiment, the adjustment channels 111D are respectively arranged on the sidewalls of the optical structural member 11D corresponding to the first lens 121D and the fifth lens 125D, so as to adjust the spatial positions of the first lens 121D and the fifth lens 125D in the internal space of the optical structural member 11D through the adjustment channels 111D. Preferably, the present embodiment applies six of the adjustment channels 111D, wherein three of the adjustment channels 111D are arranged on the sidewall of the optical structural member 111D along the preassembling position of the first lens 121D and separately arranged from one another at 120 degrees. The other three adjustment channels 111D are arranged on the sidewall of the optical structural member 111D along the preassembling position of the second lens 122D and separately arranged from one another at 120 degrees.

If the first lens 121D and the fifth lens 125D need to be adjusted, a needle can be inserted into the corresponding adjustment channel 111D. By controlling the needle to poke the first lens 121D and the fifth lens 125D, horizontal and vertical positions of the first lens 121D and the fifth lens 125D at the three spots of the corresponding adjustment channels 111D can be changed, so as to respectively conduct adjustings of the first lens 121D and the fifth lens 125D in any directions, including horizontal positions, vertical positions, and tilt positions.

Because the diaphragm 13D is preassembled on the top of the adjustable optical lens 10D, assembling position of the diaphragm 13D can be adjusted through any practicable ways.

In the present preferred embodiment, the optical structural member 11D can be implemented as a lens cone, wherein the inner wall of the optical structural member 11D spacingly has five limit structures 112D. The limit structures 112D are preferably protrudings formed by extending the inner wall of the optical structural member 11D toward the direction of the cavity thereof, so as to respectively bear five of the lenses 12D. That is, the first limit structure 1121D, the second limit structure 1122D, the third limit structure 1123D, the fourth limit structure 1124D, and the fifth limit structure 1125D respectively bear the first lens 121D, the second lens 122D, the third lens 123D, the fourth lens 124D, and the fifth lens 125D. Those skilled in the art can understand that the optical structural member 11D can also apply other ways to bear each of the lenses 12D.

It is worth mentioning that the camera module can also comprise a driver and the optical structural member 11D can be a component of the driver.

In the present preferred embodiment, the camera module can not only be a prime lens camera module, but be a auto-focus lens camera module.

Figure 17:
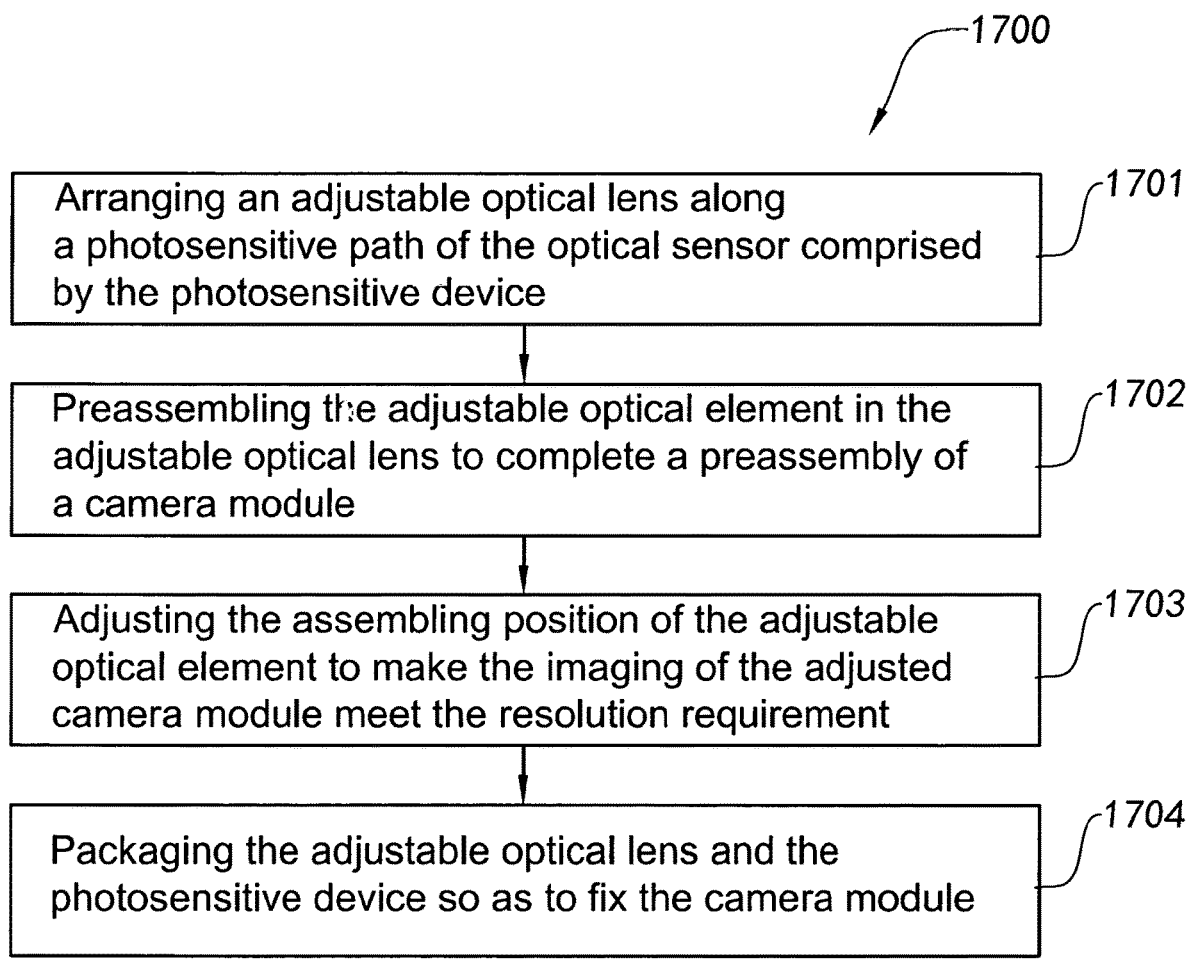
FIG. 17 is a flow diagram of a manufacturing method of the camera module according to the above another preferred embodiment of the present invention.

FIG. 17 is a flow diagram of a manufacturing method 1700 of the camera module of the present preferred embodiment, the manufacturing method 1700 of the camera module including the following steps:

step (1701): Arranging an adjustable optical lens 10D along a photosensitive path of the optical sensor 23D comprised by the photosensitive device 20B;

step (1702): preassembling the adjustable optical element in the adjustable optical lens 10D to complete a preassembly of a camera module;

step (1703): adjusting the assembling position of the adjustable optical element to make the imaging of the adjusted camera module meet the resolution requirement; and step (1704): packaging the adjustable optical lens 10D and the photosensitive device 20D so as to fix the camera module.

In the step (1701), the filter 21D, the lens mount 22D, the optical sensor 23D, and the circuit board 24D are fixedly assembled, to form the photosensitive device 20D. Also, the optical structural member 11D is fixedly assembled on the lens mount 22D. The second lens 122D, the third lens 123D, and the fourth lens 124D fixedly assembled at the corresponding limit structures 112D of the optical structural member 11D. Then adjustable optical lens 10D is set in a photosensitive path of the optical sensor 23D to complete the fixing assembling of part of the components of the camera module. These elements in the present embodiment are non-adjustable optical elements.

It is worth mentioning that in this step, assembling tolerances among each of the above elements should be controlled to the smallest to be kept within the allowable range of tolerance as long as possible, so as to avoid increases of successive adjustment or failure of successive adjusting due to overly high assembling tolerance among each of the above elements In the step (1702), the first lens 121D and the fifth lens 125D are preassembled in the optical structural member 11D and the diaphragm 13D is preassembled on the top of the optical structural member 11D. Adhesive 31D is used to conduct the preassemblings of the first lens 121D, the fifth lens 125D, and the diaphragm 13D. The adhesive 31D is then half solidified by ultraviolet exposure to finish the preassemblings of the first lens 121D, the fifth lens 125D, and the diaphragm 13D. At this point the preassembling of the camera module is produced. The first lens 121D, the fifth lens 125D, and the diaphragm 13D in the present preferred embodiment are the adjustable optical elements to make the optical lens of the camera module that comprises the adjustable optical elements become the adjustable optical lens 10D.

The step (1703) comprises the following steps:

(17031) capturing imaging of the preassembled camera module;

(17032) calculating calibration measurement for the adjustable optical element with software based on the imaging of the camera module; and (17033) adjusting assembling position of the adjustable optical element according to the calibration measurement.

In the step (1703), if the resolution requirement of the camera module fails to meet the request after the adjustable optical element was adjusted, the steps (17031) to (17033) need to be repeated until the resolution of the adjusted camera module meets the requirement.

In the step (17032) and the step (17033), the calibration measurements for the assembling positions of the first lens 121D, the fifth lens 125D, and the diaphragm 13D are respectively calculated based on the imaging of the camera module. Then according to each of the calibration measurements to respectively adjust the assembling positions of the first lens 121D, the fifth lens 125D, and the diaphragm 13D.

In the above steps, capturing of the imaging of the camera module is based on shooting a MTF (Modulation Transfer Function) testing chart with the camera module. The MTF value is applied to represent the imaging quality of the camera module. A greater MTF value indicates a higher imaging quality of the camera module. Every time when the imaging of the camera module is captured, a MTF value corresponding to the imaging needs to be calculated. The MTF value is then checked to determine if it is greater than the standard. If the MTF value is greater than or equal to the standard, the capturing is completed; if the MTF value is lower than the standard, another capturing and adjusting will be required.

It should be noted that in the process of capturing imaging every time, the environmental parameters for the shooting of the camera module, including distance between the testing chart and the camera module and the parameter of light sources, should be strictly controlled, so as to ensure the accuracy and consistency of imaging capturing for adjusting the assembling position of the adjustable optical element.

In the process of imaging capturing of the camera module, besides of calculating MTF value, other characteristics of the camera module, including stained or defective pixel, artifact, vignetting, can also be monitored and checked.

How the software adjusting of the assembling position of the adjustable optical element is based on studies of the sensibility of optical design of lens system. Method of the software to calculate the calibration measurement of the assembling positions of the first lens 121D, the fifth lens 125D, and the diaphragm 13D comprises the steps of:

measuring optical characteristics of the camera module, including MTF value, eccentricity of the optic axis, tilt of the optic axis, and field curvature before adjusting based on the imaging of the camera module; and calculating the calibration measurements for the assembling positions of the first lens 121D, the fifth lens 125D, and the diaphragm 13D based on the sensibility of the optical characteristics of the assembling positions of the first lens 121D, the fifth lens 125D, and the diaphragm 13D.

Furthermore, in the step (1703), based on the calculated calibration measurements, preassembling positions of the first lens 121D, the fifth lens 125D, and the diaphragm 13D are respectively adjusted, so as to have the first lens 121D and the fifth lens 125D in the optical structural member 11D properly turn. That is to say, the first lens 121D and the fifth lens 125D are properly adjusted in the horizontal position, vertical or axial position, or tilting position thereof. Also, the horizontal position, vertical or axial position, or tilting position of the diaphragm 13D can also be properly adjusted accordingly. After adjusting, the central axis line of the adjustable optical lens 10D and the central axis line of the optical sensor 23D are to coincide or within an allowable range of deviation. Imaging of the camera module after adjusting also meet the resolution requirement. If imaging of the camera module still fails to meet the resolution requirement after the adjustment, assembling position of the adjustable optical element should then further be adjusted.

It is worth mentioning that as the adjustable optical element is adjusted to the target position according to the calculated calibration measurement, it can be considered that the central axis line of the adjustable optical lens 10D and the central axis line of the optical sensor 23D coincide or are within an allowable range of deviation, which is to meet the target requirement that the imaging of the adjusted camera module meet the resolution requirement.

In the step (1704), solidifying the adhesive 31D through heating process fixedly attaches the first lens 121D, the fifth lens 125D, and the diaphragm 13D to the optical structural member 11D. Then the adjustment channel 111D is sealed. The present embodiment preferably conducts the sealing by injecting adhesive into the adjustment channel 111D, which seals and further fixes the first lens 121D and the second lens 122D, so as to package the adjustable optical lens 10D and the photosensitive device 20D.

Besides, in the step (1704), the present invention may set at least one adhesive injection channel 131D on the diaphragm 13D for injecting adhesive (e.g. thermosetting adhesive) to further fixed the adjusted first lens 121D and fifth lens 125D. Another implementation can have two adhesive injection channels 131D that after the first lens 121D and the fifth lens 125D are adjusted, thermosetting adhesive is injected into the adhesive injection channels 131D. After heating process of the camera module, the first lens 121D and the fifth lens 125D are turned to be completely fixed. Meanwhile the adhesive injection channels 131D can be sealed.

Those skilled in the art shall understand that the above mentioned embodiments of the present invention in the descriptions and figures are to give examples, but to confine the present invention. Objectives of the present invention are completely and effectively implemented. Notions of the functions and structures of the present invention have been shown and described in the embodiments, whereas implementations of the present invention may have modifications or changes in any ways without going against the above notions.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An adjustable optical lens of a camera module comprising an optical sensor, comprising:
   an optical structural member having an internal space along an axial direction thereof and at least one adjustment channel adapted to communicate said internal space with an external environment; and
   two or more lenses, wherein said lenses are spacedly preassembled in said internal space of said optical structural member, wherein one or more positions of at least one of said lenses in said internal space of said optical structural member is adjustable in multiple directions selected from the group consisting of horizontal direction, vertical direction, tilt direction, and peripheral direction for calibration and measured to generate a MTF (Modulation Transfer Function) value by capturing an image through said lens and the optical sensor, wherein said MTF value is configured to represent an imaging quality of said lens, wherein said MTF value corresponding to said image needs to be calculated and said MTF value is checked to determine if said MTF value is greater than a standard based on a MTF testing chart, wherein if said MTF value is greater than or equal to said standard, said position of said lens is fixed, and that if said MTF value is lower than said standard, said position of said lens is adjusted to capture another image for calibration again, wherein a center axis line of said adjustable optical lens and a center axis line of the optical sensor are coincided by adjusting said at least one of said lenses in said internal space of said optical structural member, and said adjustable optical lens and the optical sensor are packaged to fix a relative position between said lenses and the optical sensor, wherein said two or more lens is arranged in said internal space of the optical structural member corresponding to said adjustment channel, so that at least one position of said two or more lens in said internal space of said optical structural member is able to be adjusted through said adjustment channel, wherein said lens of said adjustable optical lens in said internal space of said optical structural member is able to be adjusted in horizontal direction, vertical direction, tilt direction, and peripheral direction.

2. A camera module, comprising:
   an optical device including an optical sensor; and
   an adjustable optical lens arranged along a photosensitive path of said optical sensor, wherein said adjustable optical lens comprises an optical structural member and one or more lenses, wherein said one or more lenses are spacedly preassembled in an internal space of said optical structural member along an axial direction of said optical structural member, and that before packaging said adjustable optical lens and said optical sensor, a position of at least one of said one or more lenses in said internal space of said optical structural member is adjustable along multiple directions selected from the group consisting of horizontal direction, vertical direction, tilt direction, and peripheral direction for calibration and measured to generate a MTF (Modulation Transfer Function) value by capturing an image through said lens, so as to meet a resolution requirement of said camera module, wherein said MTF value corresponding to said image needs to be calculated and said MTF value is checked to determine if said MTF value is greater than a standard based on a MTF testing chart, wherein if said MTF value is greater than or equal to said standard, said position of said lens is fixed, and that if said MTF value is lower than said standard, said position of said lens is adjusted to capture another image for calibration again, wherein a center axis line of said adjustable optical lens and a center axis line of said optical sensor are coincided by adjusting said at least one of said lenses in said internal space of said optical structural member, and said adjustable optical lens and said optical sensor are packaged to fix a relative position between said lenses and said optical sensor, wherein said lens of said adjustable optical lens in said internal space of said optical structural member is able to be adjusted in horizontal direction, vertical direction, tilt direction, and peripheral direction.

3. A camera module, comprising:
   an optical device including an optical sensor; and
   an adjustable optical lens arranged along a photosensitive path of said optical sensor, wherein said adjustable optical lens comprises an optical structural member and one or more lenses, wherein said one or more lenses are spacedly preassembled in an internal space of said optical structural member along an axial direction of said optical structural member, and that before packaging said adjustable optical lens and said optical sensor, a position of at least one of said one or more lenses in said internal space of said optical structural member is adjustable along multiple directions selected from the group consisting of horizontal direction, vertical direction, tilt direction, and peripheral direction for calibration and measured to generate a MTF (Modulation Transfer Function) value by capturing an image through said lens, so as to meet a resolution requirement of said camera module, wherein said MTF value corresponding to said image needs to be calculated and said MTF value is checked to determine if said MTF value is greater than a standard based on a MTF testing chart, wherein if said MTF value is greater than or equal to said standard, said position of said lens is fixed, and that if said MTF value is lower than said standard, said position of said lens is adjusted to capture another image for calibration again, wherein a center axis line of said adjustable optical lens and a center axis line of said optical sensor are coincided by adjusting said at least one of said lenses in said internal space of said optical structural member, and said adjustable optical lens and said optical sensor are packaged to fix a relative position between said lenses and said optical sensor, wherein said optical structural member has at least one adjustment channel adapted to communicate said internal space of said optical structural member with an external environment, and said lens is arranged in said internal space of the optical structural member corresponding to said adjustment channel, so that at least one position said lens in said internal space of said optical structural member is able to be adjusted through said adjustment channel, wherein said lens of said adjustable optical lens in said internal space of said optical structural member is able to be adjusted in horizontal direction, vertical direction, tilt direction, and peripheral direction.

\* \* \* \* \*